US012566377B2

(12) United States Patent
De Schepper et al.

(10) Patent No.: US 12,566,377 B2
(45) Date of Patent: Mar. 3, 2026

(54) MULTIPLE PATTERNING WITH ORGANOMETALLIC PHOTOPATTERNABLE LAYERS WITH INTERMEDIATE FREEZE STEPS

(71) Applicant: Inpria Corporation, Corvallis, OR (US)

(72) Inventors: Peter De Schepper, Wijnegem (BE); Jason K. Stowers, Corvallis, OR (US); Sangyoon Woo, Heverlee (BE); Michael Kocsis, Albany, OR (US); Alan J. Telecky, Albany, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

(21) Appl. No.: 18/389,961

(22) Filed: Dec. 20, 2023

(65) Prior Publication Data

US 2024/0118614 A1 Apr. 11, 2024

Related U.S. Application Data

(62) Division of application No. 17/307,223, filed on May 4, 2021, now Pat. No. 11,886,116.

(Continued)

(51) Int. Cl.
*G03F 7/039* (2006.01)
*G03F 1/22* (2012.01)
(Continued)

(52) U.S. Cl.
CPC .............. *G03F 7/0392* (2013.01); *G03F 1/22* (2013.01); *G03F 1/48* (2013.01); *G03F 7/0017* (2013.01);
(Continued)

(58) Field of Classification Search
None
See application file for complete search history.

(56) References Cited

U.S. PATENT DOCUMENTS

| | | |
|---|---|---|
| 5,302,198 A | 4/1994 | Allman |
| 5,440,138 A | 8/1995 | Nishi |

(Continued)

FOREIGN PATENT DOCUMENTS

| | | |
|---|---|---|
| JP | 2003-303824 A | 10/2003 |
| JP | 2004-253680 A | 9/2004 |

(Continued)

OTHER PUBLICATIONS

Jiang et al., "Metal Oxide Nanoparticle Photoresists for EUV Patterning," Journal of Photopolymer Science and Technology, 27(5), 663-666, (2014).

(Continued)

*Primary Examiner* — Martin J Angebranndt
(74) *Attorney, Agent, or Firm* — Christensen, Fonder, Dardi; Diane E. Bennett; Peter S. Dardi

(57) ABSTRACT

Multiple patterning approaches using radiation sensitive organometallic materials is described. In particular, multiple patterning approaches can be used to provide distinct multiple patterns of organometallic material on a hardmask or other substrate through a sequential approach that leads to a final pattern. The multiple patterning approach may proceed via sequential lithography steps with multiple organometallic layers and may involve a hardbake freezing after development of each pattern. Use of an organometallic resist with dual tone properties to perform pattern cutting and multiple patterning of a single organometallic layer are described. Corresponding structures are also described.

13 Claims, 16 Drawing Sheets

Related U.S. Application Data

(60) Provisional application No. 63/020,778, filed on May 6, 2020.

(51) Int. Cl.

| | |
|---|---|
| *G03F 1/48* | (2012.01) |
| *G03F 7/00* | (2006.01) |
| *G03F 7/004* | (2006.01) |
| *G03F 7/038* | (2006.01) |
| *G03F 7/11* | (2006.01) |
| *G03F 7/20* | (2006.01) |
| *G03F 7/42* | (2006.01) |

(52) U.S. Cl.
CPC .......... *G03F 7/0042* (2013.01); *G03F 7/0382* (2013.01); *G03F 7/11* (2013.01); *G03F 7/2004* (2013.01); *G03F 7/2037* (2013.01); *G03F 7/42* (2013.01)

(56) References Cited

U.S. PATENT DOCUMENTS

| | | | |
|---|---|---|---|
| 6,566,276 | B2 | 5/2003 | Maloney et al. |
| 7,160,746 | B2 | 1/2007 | Zhong et al. |
| 7,270,886 | B2 | 9/2007 | Lee et al. |
| 7,914,974 | B2 | 3/2011 | Guerrero et al. |
| 8,415,000 | B2 | 4/2013 | Stowers et al. |
| 8,647,981 | B1 | 2/2014 | Sipani |
| 8,703,386 | B2 | 4/2014 | Bass et al. |
| 8,907,456 | B2 | 12/2014 | Wei |
| 9,005,875 | B2 | 4/2015 | Bristol et al. |
| 9,102,129 | B2 | 8/2015 | Krishnamurthy et al. |
| 9,176,377 | B2 | 11/2015 | Stowers et al. |
| 9,310,684 | B2 | 4/2016 | Meyers et al. |
| 9,372,402 | B2 | 6/2016 | Freedman et al. |
| 9,679,095 | B1 | 6/2017 | Li |
| 10,228,618 | B2 | 3/2019 | Meyers et al. |
| 10,627,719 | B2 | 4/2020 | Waller et al. |
| 10,642,153 | B2 | 5/2020 | Meyers et al. |
| 10,649,328 | B2 | 5/2020 | Stowers et al. |
| 2002/0076495 | A1 | 6/2002 | Maloney et al. |
| 2002/0157418 | A1 | 10/2002 | Ganguli et al. |
| 2005/0118800 | A1 | 6/2005 | Brakensiek et al. |
| 2007/0037014 | A1 | 2/2007 | Nagata |
| 2007/0048674 | A1 | 3/2007 | Wells |
| 2007/0105055 | A1 | 5/2007 | Shirasagi et al. |
| 2007/0166648 | A1 | 7/2007 | Ponoth et al. |
| 2007/0190762 | A1 | 8/2007 | Franciscus Van Haren et al. |
| 2009/0117491 | A1* | 5/2009 | Hendel ................... G03F 7/203 430/296 |
| 2009/0131295 | A1 | 5/2009 | Cui |
| 2009/0155546 | A1 | 6/2009 | Yamashita et al. |
| 2009/0231648 | A1 | 9/2009 | Imanshi et al. |
| 2010/0187658 | A1 | 7/2010 | Wei |
| 2011/0003253 | A1* | 1/2011 | Miyamoto ........... G03F 7/0035 430/312 |
| 2011/0033799 | A1 | 2/2011 | Watanabe et al. |
| 2011/0091812 | A1* | 4/2011 | Hatakeyama ......... G03F 7/0045 430/326 |
| 2012/0223418 | A1 | 9/2012 | Stowers et al. |
| 2013/0189846 | A1 | 7/2013 | Doebler |
| 2013/0224652 | A1 | 8/2013 | Bass et al. |
| 2014/0065823 | A1 | 3/2014 | Sipani |
| 2014/0199615 | A1* | 7/2014 | Burkhardt ................. G03F 1/36 430/5 |
| 2014/0227643 | A1 | 8/2014 | Hatakeyama et al. |
| 2015/0040083 | A1 | 2/2015 | Cheng et al. |
| 2015/0056542 | A1 | 2/2015 | Meyers et al. |
| 2015/0160557 | A1 | 6/2015 | deVillers |
| 2015/0234272 | A1 | 8/2015 | Sarma et al. |
| 2015/0243518 | A1 | 8/2015 | deVilliers |
| 2015/0253667 | A1 | 9/2015 | Bristol et al. |
| 2016/0116839 | A1 | 4/2016 | Meyers et al. |
| 2017/0102612 | A1 | 4/2017 | Meyers et al. |
| 2017/0146909 | A1 | 5/2017 | Smith et al. |
| 2017/0261850 | A1 | 9/2017 | Stowers et al. |
| 2017/0343896 | A1 | 11/2017 | Darling et al. |
| 2018/0025936 | A1 | 1/2018 | Singh et al. |
| 2018/0240699 | A1 | 8/2018 | Chan et al. |
| 2018/0315617 | A1 | 11/2018 | Zi et al. |
| 2019/0153001 | A1 | 5/2019 | Cardineau et al. |
| 2019/0308998 | A1 | 10/2019 | Cardineau et al. |
| 2019/0341253 | A1 | 11/2019 | Ibata et al. |
| 2020/0124970 | A1 | 4/2020 | Kocsis et al. |
| 2020/0326627 | A1 | 10/2020 | Jiang et al. |

FOREIGN PATENT DOCUMENTS

| | | | | |
|---|---|---|---|---|
| JP | 2005-156576 | A | 6/2005 | |
| JP | 3982281 | B2 | 9/2007 | |
| JP | 2007-281428 | A | 10/2007 | |
| JP | 2010-501881 | A | 1/2010 | |
| JP | 2014-048508 | A | 3/2014 | |
| JP | 2014-239191 | A | 12/2014 | |
| JP | 2016-530565 | A | 9/2016 | |
| KR | 10-2005-0054064 | A | 6/2005 | |
| KR | 2012034989 | A * | 4/2012 | .......... G03F 7/2022 |
| KR | 10-2012-0092950 | A | 8/2012 | |
| KR | 2014081545 | A * | 7/2014 | ........ G03F 7/70466 |
| KR | 10-1839255 | B1 | 3/2018 | |
| WO | 2015-026482 | A2 | 2/2015 | |

OTHER PUBLICATIONS

International Search Report and Written Opinion for corresponding Patent Application PCT/US2021/030562 dated Aug. 25, 2021.

Office Action from corresponding Japanese Patent Application No. 2022-567248 dated Feb. 4, 2025.

* cited by examiner

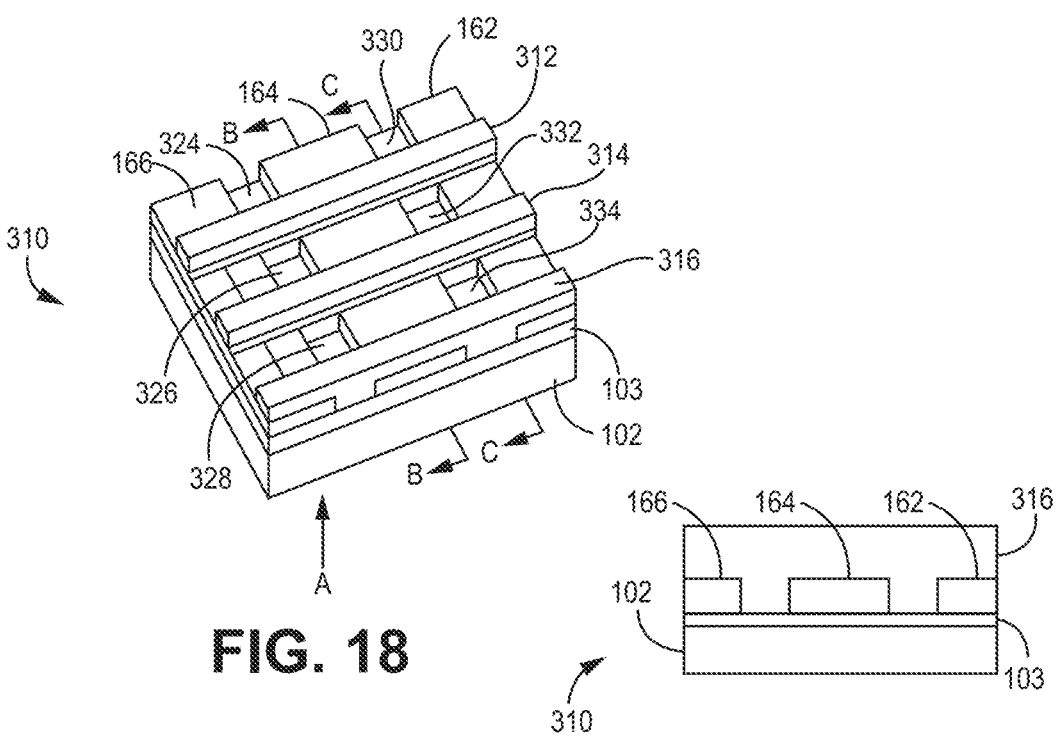
FIG. 18
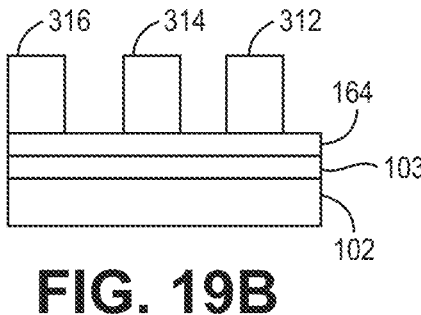
FIG. 19A
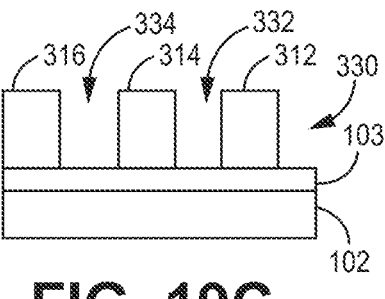
FIG. 19B
FIG. 19C

MULTIPLE PATTERNING WITH ORGANOMETALLIC PHOTOPATTERNABLE LAYERS WITH INTERMEDIATE FREEZE STEPS

CROSS REFERENCE TO RELATED APPLICATIONS

This application is a divisional of U.S. patent application Ser. No. 17/307,223, filed May 4, 2021 to Stowers et al., entitled "Multiple Patterning With Organometallic Photopatternable Layers With Intermediate Freeze Steps," which claims priority to copending U.S. provisional patent application 63/020,778, filed May 6, 2020 to Stowers et al., entitled "Multiple Patterning With Organometallic Photopatternable Layers With Intermediate Freeze Steps," incorporated herein by reference.

FIELD OF THE INVENTION

This application is directed to multiple patterning approaches based on organometallic photopatternable materials that allow for exploitation of high etch contrast. The invention is further directed to structures achievable using multiple layer patterning with organometallic radiation patternable resists.

BACKGROUND OF THE INVENTION

In the effort to continue to reduce device sizes produced from lithography, photolithographic systems have been developed to use extreme ultraviolet light which has very short wavelengths that can allow for very small image formation. Organometallic coatings have been shown to be useful as suitable photoresist materials for achieving high-resolution patterning and are very promising for commercial use for patterning using extreme ultraviolet light as well as for electron-beam patterning. To fully exploit organometallic resists, pragmatic improvements in processing for commercial environments can allow for the exploitation of the full potential for these materials.

Multiple patterning methods are increasingly used for the fabrication of integrated devices having features of high density and high resolution. In general, integrated circuit performance scales with decreasing device size and increasing device density so it is therefore desirable for the sizes of printed features defining individual devices to decrease and for the associated feature density to increase. However, as desired patterned features become smaller and approach the resolution limits of a given exposure source, for example extreme ultraviolet (EUV), it becomes more difficult to resolve features with sufficient accuracy and fidelity.

SUMMARY OF THE INVENTION

The invention described herein is directed to multiple patterning approaches using organometallic photopatternable materials and structures achievable using these approaches.

In a first aspect, the invention pertains to a method for patterning a substrate, the method comprising irradiating a layer of a photosensitive composition over a patterned understructure to form a latent image, wherein the photosensitive composition comprises an organometallic composition with radiation sensitive ligands bound to the metal, wherein the patterned understructure comprises sequentially a substrate, an unpatterned hardmask layer over the substrate, and a patterned metal oxide based material having a first pattern over the hardmask layer, with the photosensitive composition located over the hardmask layer with the patterned metal oxide based material, wherein the pattern corresponding to the latent image is distinct from the first pattern, and wherein the hardmask layer has differential etching relative to the irradiated photosensitive composition and the patterned metal oxide based material and developing the latent image to form a second pattern from irradiated photosensitive composition to form a developed structure.

In a further aspect, the invention pertains to a structure comprising a substrate; an unpatterned hardmask coating on the substrate; a first pattern of a first tin oxide based material over the hardmask coating, wherein gaps in the first pattern do not cover the hardmask; and a second pattern of a second tin oxide based material over the hardmask coating with the first pattern, wherein the second pattern is distinct from the first pattern, with the proviso that if the second pattern does not overlap with the first pattern the line width roughness of the first pattern is less than a quarter of the feature to feature distance of the first pattern.

In additional aspects, the invention pertains to a method of forming a patterned structure using radiation based lithography, the method comprising performing a positive tone development step on a latent image formed in a patterning composition, such as an organometallic patterning composition, deposited over a patterned metal composition supported on a structure, wherein the positive tone development step removes an irradiated portion of the latent image in the organometallic patterning composition and an exposed portion of the patterned metal composition to form a cut pattern in the patterned metal composition.

In other aspects, the invention pertains to a method for forming a patterned structure, the method comprising irradiating a structure according to a first pattern to form a first latent image, the structure comprising a layer of organometallic radiation sensitive material and a substrate; further irradiating the structure with the first latent image according to a second pattern to form a second latent image superimposed on the first latent image, wherein the first latent image and the superimposed second latent image form a composite latent image; and developing the structure with the composite latent image to form the patterned structure.

BRIEF DESCRIPTION OF THE DRAWINGS

FIG. 18 is a schematic perspective view of the structure of FIG. 16 after development of the latent image to remove un-irradiated photosensitive organometallic material from the second photosensitive organometallic layer to form a double patterned crosshatched structure on the hardmask-coated substrate.

FIG. 19A is a side view of the structure of FIG. 18.

FIG. 19B is a cross-section view along plane B-B of the structure of FIG. 18.

FIG. 19C is a cross-section view along plane C-C of the structure of FIG. 18.

DETAILED DESCRIPTION OF THE INVENTION

Figure 1A:
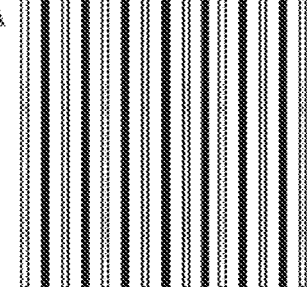
FIG. 1A is a representation of a half-pitch line-space pattern which may be formed via the metal oxide-freezing-metal oxide process disclosed herein.

The properties of organometallic radiation sensitive resist compositions are exploited for advantageous multiple patterning processes that provide for the formation of desirable structures involving the multiple patterns. In some embodiments, a hardmask layer between the resist compositions and the substrate provide for more effective pattern transfer allowing for various substrate compositions. In particular, organometallic radiation sensitive resists with high etch contrast have been developed that can be cured to form metal oxide based compositions with increasing degree of oxidation based on process conditions. The organometallic resists can be used to form high resolution patterns. After the first pattern is formed, a freeze step can be performed, such as through heating the patterned structure to further dehydrate the resist to form a metal oxide or a more oxidized composition closer in structure to a metal oxide composition. In alternative embodiments, a freeze step is not performed after the first patterning step to facilitate cutting the first pattern in a second pattering step. In some embodiments, the frozen structure is desirably stable for deposition and patterning of another layer of organometallic resist composition. Following deposition of a further layer of resist composition, the second layer is again patterned through radiation exposure and development. In additional embodiments, a single resist layer is exposed through multiple masks followed by a single development step to develop the latent image formed through the multiple masks. Organometallic resists can be effectively used to form high-resolution patterns and can be effective for EUV patterning. Suitable resists can be used for both negative tone and positive tone patterning to efficiently allow more multiple patterning options using the same composition for predictably reproducible multiple patterning, although adjustment of resist compositions can be made to optimize subsequent patterning steps. Subsequent or intermittent processing can be used to improve pattern quality.

Multiple patterning techniques can be used to improve pattern resolution to extend the practical patterning capabilities achievable with a particular patterning system. For a first pattern, various features can be formed, which may be on a regular pattern, such as a pattern of stripes. The second pattern can be overlapping with the first pattern, located within the first pattern or a combination of overlapping and within the first pattern. The second pattern can alternatively be used to cut the first pattern. The sequential patterning steps provide for the formation of structures that generally are not readily formed with a single patterning step to achieve higher resolution or more intricately placed features. If desired, a third or more additional pattering steps can be performed. From a practical level, there are limits to the number of sequential patterning steps to provide well-defined and properly developed features, but creative mask formation may allow for extending the number of useful patterns, such that multiple patterning generally can involve 2, 3, 4, 5, 6, 7 or more patterning steps on a single layer of hardmask on a substrate.

Also, compatible positive tone patterning can provide for a cut step as a multiple patterning step, and one or more cut steps with positive tone patterning can be performed after one negative tone patterning step or a plurality of multiple sequential negative tone patterning steps, or interspersed as cut steps between one or more initial negative tone patterning steps and one or more subsequent negative tone patterning steps. The positive tone patterning as a cut step can be performed using an organometallic patterning composition or an organic photoresist, such as chemically amplified resists, as described further below. The high development contrast of organometallic patterning compositions can be used to provide for multiple patterning using two or more exposure steps using different masks followed by a development step of the latent image formed from the multiple exposures. Such multiple exposure followed by development forms of multiple patterning can be combined with additional negative tone patterning steps and positive tone cut steps as described herein.

The formation of integrated electronic devices and the like generally involves the patterning of the materials to form individual elements or components within the structures. This patterning can involve different compositions covering selected portions of stacked layers that interface with each other vertically and/or horizontally to induce desired functionality. The various materials can comprise semiconductors, which can have selected dopants, dielectrics, electrical conductors and/or other types of materials. To form ultimate components, such as integrated circuits, generally many layers are formed and patterned to form the eventual structures with different materials at locations defined both by position in the stack and by position along the substrate.

To form high resolution patterns, radiation sensitive organic compositions can be used to introduce patterns, and the compositions can be referred to as resists since portions of the composition are processed to be resistant to development/etching such that selective material removal can be used to introduce a selected pattern. Irradiation with the selected pattern or the negative of the pattern can be used to expose the resist and to form a pattern or latent image with developer resistant regions and developer dissolvable regions. The radiation sensitive organometallic compositions described herein can be used for the direct formation of desired inorganic material structures within the device and/or as a radiation patternable organometallic resist. In either case, significant processing improvements can be exploited, and the structure of the patterned metal oxide based material can be also improved.

Some multiple patterning methods are known in the art, such as spacer aligned double patterning (SADP), spacer aligned quadruple patterning (SAQP) and the like, but these approaches typically require multiple processing steps which increases cost of production and can increase susceptibility of the patterning to defect formation. Therefore, patterning approaches are desirable that can improve patterning performance without vastly increasing processing complexity. Efficient multiple patterning approaches are described herein that take advantage of high etch contrast available with new generation resist materials. More efficient patterning approaches available with these next generation patternable materials are contrasted with traditional multiple patterning approaches below.

Organometallic photoresists, such as metal oxide hydroxide compositions with radiation sensitive ligands, in particular, enable methods for performing multiple patterning steps by using a freeze process, such as a thermal freeze process, for appropriate embodiments. In a freeze process, a first photoresist layer is deposited, exposed, and developed to form a first pattern. This first pattern then undergoes a process to "freeze" the pattern, and suitable freeze processes can be exposure to blanket UV light and/or a thermal bake step. After freezing the first pattern, a second layer of photoresist can be deposited to also undergo exposure and development to result in a second pattern. By combining two or more photoresist freeze processes together selected patterns can be achieved that would require more cumbersome processes such as spacer aligned multiple patterning (SAMP) or other processes that require one or more intermediate etch or deposition processes.

Metal oxide hydroxide compositions can exhibit either positive tone patterning or negative tone patterning behavior. In negative tone patterning, exposure to radiation converts the irradiated coating material into a material that is more resistant to removal with a developer composition relative to the non-irradiated coating material. In positive tone patterning, exposure sufficiently changes the polarity of the exposed coating material, e.g., increasing the polarity, such that the exposed coating material can be selectively removed with an aqueous solvent or other highly polar solvent. Selective removal of at least a portion of the coating material leaves a pattern where regions have been removed to expose the underlying substrate.

Negative tone patterning is particularly desirable for a lower level in a multiple pattering process since the initially patterned and developed layer is not significantly affected by further irradiation in a subsequent patterning step. If the lower pattern is a positive tone resist, this resist can be further altered by a subsequent irradiation step. Thus, if the positive tone pattern on the lower level is not protected by a hardmask or the like during the development of an upper level, the lower pattern can be damaged in a subsequent development step. Therefore, organometallic resists that can be used for negative tone patterning with small feature size are particularly well suited for multiple patterning with fewer process steps. In view of the ability to use a positive tone development process with an organometallic patterning composition for a subsequent pattern step, allows for cutting of previously formed patterns, which provides a further process advantage for organometallic patterning compositions for multiple patterning processes.

Suitable photoresists can be based on metal oxide chemistry (metal oxo/hydroxo compositions) using radiation sensitive ligands to control stability and processability of the resists. In general, these resist compositions function as negative tone photoresists when developed with organic solvents. Suitable resist compositions can have a peroxo ligand to provide radiation sensitivity. Peroxo-based resist compounds are discussed in U.S. Pat. No. 8,415,000B2 to Stowers et al., entitled "Patterned Inorganic Layers, Radiation Based Patterning Compositions and Corresponding Methods," and in U.S. Pat. No. 8,703,386B2 to Bass et al., entitled "Metal Peroxo Compounds With Organic Co-ligands for Electron Beam, Deep UV and Extreme UV Photoresist Applications," both of which are incorporated herein by reference. Tin compositions are exemplified herein, and while the data presented herein focuses on tin-based resists, the processing approaches and developer compositions described herein can be expected to be effective for other metal-based resists, such as those described above and below.

Organometallic photoresists such as organotin oxide hydroxides have been shown to possess excellent properties as photoresists for use in lithographic photopatterning. Suitable organometallic photoresists include organotin materials as described in U.S. Pat. No. 9,310,684B2 to Meyers et al., entitled "Organometallic Solution Based High Resolution Patterning Compositions," published U.S. Pat. No. 10,642,153 to Meyers et al., entitled "Organometallic Solution Based High Resolution Patterning Compositions and Corresponding Methods," and U.S. Pat. No. 10,228,618B2 entitled "Organotin Oxide Hydroxide Patterning Compositions, Precursors, and Patterning", all of which are incorporated herein by reference. Other organometallic patterning compositions based on various metals are described in published U.S. patent application 2002/0076495 to Maloney et al., entitled "Method of Making Electronic Material," and U.S. Pat. No. 9,372,402B2 to Freedman et al., entitled "Molecular Organometallic Resists for EUV," both of which are incorporated herein by reference. Resists with metal oxide nanoparticles encased with organic shell-like coatings are described in published U.S. patent application 2015/0234272A1 to Sarma et al., entitled "Metal Oxide Nanoparticles and Photoresist Compositions," incorporated herein by reference. Applicant has developed organotin patterning materials that have been progressed to a high degree, and some of these are the exemplified compositions.

Suitable organotin materials can be based on the chemistry of radiation sensitive patterning compositions represented by the formula $R_z SnO_{(2-(z/2)-(x/2))}(OH)_x$ where $0 < z \le 2$ and $0 < (z+x) \le 4$, in which R is a hydrocarbyl group with 1-31 carbon atoms or blends thereof with distinct R groups, which can be written as $R_N$, for N distinct compositions. In a coating layer, the compositions can be integrated into a common oxo/hydroxo network. R forms a carbon-tin bond, and R can comprise heteroatoms, which are not carbon or hydrogen. In particular, branched alkyl ligands can be desirable for some patterning compositions where the compound can be represented generally as $R^1R^2R^3CSn\ O_{(2-(z/2)-(x/2))}(OH)_x$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to hydrolysable ligands, such as alkoxide or amide moieties. In some embodiments, $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —CH$_2$CH$_3$), sec-butyl ($R^1$ is methyl, $R^2$ is —CH$_2$CH$_3$, and $R^3$ is hydrogen), neopentyl ($R^1$ and $R^2$ are hydrogen, and $R^3$ is —C(CH$_3$)$_3$), cyclohexyl, cyclopentyl, cyclobutyl, and cyclopropyl. Examples of suitable cyclic groups include, for example, 1-adamantyl (—C(CH$_2$)$_3$(CH)$_3$(CH$_2$)$_3$ or tricyclo(3.3.1.13,7) decane bonded to the metal at a tertiary carbon) and 2-adamantyl (—CH (CH)$_2$(CH$_2$)$_4$(CH)$_2$(CH$_2$) or tricyclo(3.3.1.13,7) decane bonded to the metal at a secondary carbon). In other embodiments, hydrocarbyl groups may include aryl or alkenyl groups, for example, benzyl or allyl, or alkynyl groups. In other embodiments, the hydrocarbyl ligand R may include any group consisting solely of C and H and containing 1-31 carbon atoms. In summary, some examples of suitable alkyl groups bonded to tin include, for example, linear or branched alkyl (i-Pr((CH$_3$)$_2$CH-), t-Bu ((CH$_3$)$_3$C-), Me (CH$_3$-), n-Bu (CH$_3$CH$_2$CH$_2$CH$_2$-)), cyclo-alkyl (cyclo-propyl, cyclo-butyl, cyclo-pentyl), olefinic (alkenyl, aryl, allylic), or alkynyl groups, or combinations thereof. In further embodiments, suitable R groups may include hydrocarbyl groups substituted with hetero-atom functional groups including cyano, thio, silyl, ether, keto, ester, or halogenated groups or combinations thereof. As is conventional in this art, the hydrocarbyl group can be referred to as an alkyl group even though the group can have unsaturated bonds, aryl groups, heteroatoms, and so forth, and thus a monoalkyl compound/composition would refer to a compound/composition where z=1.

Precursor compositions can be employed to form organotin oxo/hydroxyl coating compositions that integrate into a common oxo/hydroxo network. The precursor compositions can comprise one or more soluble organotin oxo/hydroxo compounds, or corresponding compounds with hydrolyzable ligands that form oxo and/or hydroxo ligands upon hydrolysis. For precursor compositions with a plurality of compounds, the compounds can have distinct organic ligands with metal-carbon bonds and the same or distinct hyrolyzable ligands. Thus, precursor compositions to form the radiation sensitive coatings can comprise solutions of one or more compounds represented by $R_n SnX_{4-\alpha}$ where n=1, 2, or 3, in which R is a hydrocarbyl group with 1-31 carbon atoms, such as described above, and X is a ligand with a hydrolysable M—X bond, and mixtures thereof. Suitable hydrolysable ligands can include, for example, alkynides ($R^0 C \equiv C$—), alkoxides ($R^0 O$-), carboxylates ($R^0 COO$-), halides, dialkylamides or combinations thereof, where the $R^0$ group can be one of the same moieties described above for R. In particular, organotin trialkoxide compositions can be represented by the formula $RSn(OR^0)_3$. Also, organotin tridialkylamide compositions can be represented by the formula $RSn(NR^a R^b)_3$, where the Ra and R b groups can be one of the same moieties described above for R. In some embodiments, the aforementioned organotin precursor compositions can further comprise compositions represented by MX$_4$ and/or MO$_{((m/2)-l/2)}(OH)_l$ where $0 < z \le 2$, $0 < (z+w) \le 4$, m=formal valence of M$^{m+}$, $0 \le l \le m$, and M=M' or Sn, where M' is a non-tin metal of groups 2-16 of the periodic table.

In general, organotin photoresists exhibit both high resolution and high etch resistances that enable the formation of small features and patterns. In situ hydrolysis during the coating process or after a coating step can be used to hydrolyze any hydrolyzable M—X bonds to form an oxo/hydroxo network in the coating prior to patterning. The precursor compounds can also form clusters in solution with appropriate ligand rearrangement, in which at least some of the hydrolyzable ligands may be replaced with oxo bridges or hydroxyl groups, such as with three tin atoms, as described in published U.S. patent applications 2019/0153001 to Cardineau et al., entitled "Organotin Clusters, Solutions of Organotin Clusters, and Application to High Resolution Patterning," and 2019/0308998 to Cardineau et al., entitled "Tin Dodecamers and Radiation Patternable Coatings With Strong EUV Absorption," both of which are incorporated herein by reference.

The compositions described above can be used to deposit and form a layer of coating material via various means known by those skilled in the art, and subsequent processing of the precursor onto a selected structure. Generally, the structure comprises a substrate with a hard mask coating over its surface. The hard mask surface provides for patterning uniformity while undergoing the multiple patterning steps being performed to reduce pattern feature size. Hard mask layers can comprise a material with a good etch contrast with the patterned resist. In some embodiments, the hard mask is designed to be ultimately removed, but in some embodiments patterned portions of the hardmask should be maintained for subsequent processing. Selection of the hardmask can be based on compatibility and possibly etch contrast with the material below the hardmask in the substrate, which may itself be patterned with different materials.

The multiple pattering with organometallic resists as described herein provides significant flexibility to efficiently provide high resolution patterning based on high development contrast and good radiation absorption. Various implementations of multiple patterning can effectively be exploited to form a variety of ultimately desired patterns. Use of tin based organometallic patterning compositions, improved developers and post development pattern quality improvement can be exploited to reduce pattern imperfections.

Coating Properties and Coating Formation

Deposition processes to form radiation patternable layers can be solution based or vapor based. A substrate generally presents a surface onto which the coating material can be deposited, and the substrate may comprise a plurality of layers. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof.

In some embodiments, a hardmask layer is formed over the substrate prior to deposition of radiation patternable coatings. A hardmask layer can have an average thickness from about 1 nm to about 200 nm, in further embodiments from about 2 nm to about 150 nm, in other embodiments form about 2.5 nm to about 100 nm, and in additional embodiments form about 3 nm to about 75 nm. A person of ordinary skill in the art will recognize that additional ranges within the explicit average thickness ranges above are contemplated and are within the present disclosure. With the goal being to realize a desired pattern in a desired substrate (such as silicon), desired hardmask materials can be typically chosen for their etch properties with respect to the other layers. In general, the hardmask materials are chosen and layered into a film stack based upon their etch "color", where the "color" refers to etch susceptibility to some etch chemistry.

Suitable materials for the hardmask layer can include, for example, titanium nitride (TiN), silicon nitride ($Si_3N_4$), tantalum nitride (TaN), silicon oxides ($SiO_2$, spin-on-glass, silicon oxynitride), and carbon-rich materials (such as, spin coated carbon (SOC), CVD carbon layers), although a range of other materials may be suitable. With respect to differential etching, for example, silicon oxide type of materials have appreciable etch rate in F-containing plasmas, whereas carbon-rich materials do not. Similarly, carbon-rich materials can be readily etched with an O-containing plasma, whereas silicon oxide is resistant. TiN can be etched with Cl-containing plasmas, whereas $SiO_2$ is resistant. Different final patterns may suggest different etch stacks, e.g. a complex logic pattern having lots of lines, spaces, and rectangular features may be patterned with a different film stack than a memory pattern that consists of arrays of dots or holes. Holes can be roughly circular, rectangular, square, or other reasonable shapes. Based on the teachings herein, selection of suitable hardmask materials, stack configurations, etch chemistries, and relative etch differentials thereof are known by those of ordinary skill in the art and are within the scope of the present disclosure.

Hardmasks can be deposited with vapor depositions approaches, such as chemical vapor deposition (CVD), physical vapor deposition (PVD), or atomic layer deposition (ALD), or solution based coating approaches such as with spin-on-glass or spin-on-carbon. Spin-on-carbon (SoC) generally refers to compositions with a high carbon content that can be deposited as liquids and generally comprise, for example, high carbon content polymers, or molecules such as fullerenes, which are commercially available as spin-on carbon from Irresistible Materials, Ltd, UK. Spin-on-glass materials are available commercially, such as from Desert Silicon (AZ, USA). Spin-on-glass compositions can comprise polysilazane polymers in a suitable organic solvent, such as an ether or an aromatic solvent, and the polysilazane polymer can be cured in an oxygen atmosphere to form silicon oxide. Polysilazane compositions for spin-on glasses are described in U.S. Pat. No. 7,270,886 to Lee et al., entitled "Spin-On Glass Composition and Method of Forming Silicon Oxide Layer Semiconductor Manufacturing Process Using the Same," incorporated herein by reference. Spin-on glass formulations with polyorganosiloxanes are described in U.S. Pat. No. 5,302,198 to Allman, entitled "Coating Solution for Forming Glassy Layers," incorporated herein by reference. Suitable silica based sol-gel compositions are known in the art and can be used as the spin-on glass compositions. For example, sol-gel compositions for the formation of silica glass materials are described in published U.S. patent application 2002/0157418 to Ganguli et al., entitled "Process for Reducing or Eliminating Bubble Defects in Sol-Gel Silica Glass," incorporated herein by reference. The spin-on glass compositions can be cured with heat in an oxygen containing atmosphere to form silica glass. Silica glass is commonly deposited in a variety of contexts using chemical vapor deposition (CVD) or other processes known in the art.

Also, suitable substrates can comprise previously formed organometallic photoresist patterns. Furthermore, substrates can also comprise pre-patterned structures as described in U.S. Pat. No. 10,649,328 by Stowers et al., entitled "Pre-Patterned Lithography Templates, Processes Based on Radiation Patterning Using the Templates and Processes To Form the Templates", and U.S. Pat. No. 9,005,875 by Bristol et al., entitled "Pre-Patterned Hard Mask for Ultrafast Lithographic Imaging", both incorporated herein by reference. In general, substrates can comprise multiple layers of different or partially different compositions, in which each layer may be itself patterned, for example, with components or portions of components that may be integrated with further components or portions of components based on the further lithography processing to pattern additional layer over the substrate and/or in the substrate.

Examples of suitable deposition methods for organometallic resists include solution processing methods such as spin coating or dip coating, or vapor deposition methods such as atomic layer deposition (ALD), physical vapor deposition (PVD), or chemical vapor deposition (CVD) processes can be used to form organometallic coatings. If solution processing is desired then it is desirable for the organotin compositions to be dissolved in a solvent to aid in the deposition process. In general, the desired organotin compositions can be dissolved in an organic solvent, e.g., alcohols, aromatic and aliphatic hydrocarbons, esters or combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, 1-butanol, methanol, isopropyl alcohol, 1-propanol), ketones (e.g., methyl ethyl ketone), mixtures thereof, and the like. In general, organic solvent selection can be influenced by solubility parameters, volatility, flammability, toxicity, viscosity and potential chemical interactions with other processing materials. After the components of the solution are dissolved and combined, the character of the species may change, in some embodiments, as a result of partial in-situ hydrolysis, hydration, and/or condensation. When the composition of the solution is referenced herein, the reference is to the components as added to the solution, since complex formulations may undergo solvolysis and ligand metathesis, or produce metal polynuclear species in solution that may not be well characterized. For certain applications it is desirable for the organic solvent to have a flash point of no less than about 10° C., in further embodiments no less than about 20° C. and in further embodiment no less than about 25° C. and a vapor pressure at 20° C. of no more than about 10 kPa, in some embodiments no more than about 8 kPa and in further embodiments no more than about 6 kPa. A person of ordinary skill in the art will recognize that additional ranges of flash point and vapor pressure within the explicit ranges above are contemplated and are within the present disclosure.

In some embodiments, vapor deposition methods can comprise reacting one or more metal-containing precursors are reacted on or more with small molecule gas-phase reagents such as $H_2O$, $H_2O_2$, $O_3$, $O_2$, $CO_2$, CO, or $CH_3OH$, which serve as O and H sources for production of oxides and oxide hydroxides. In CVD methods, two or more reactant gases are generally mixed in the chamber in the vicinity of the substrate surface. Therefore, sufficient stability can be designed into the reaction conditions to control undesirable vapor-phase reactions and nucleation. ALD precursors, introduced separately and sequentially to the reaction chamber, typically react with chemisorbed co-precursor or decomposition products saturating the substrate surface. Desirable features of $R_nSnX_{(4-n)}$ precursors include, for example, sufficient volatility for vapor-phase transport in the system, thermal stability to prevent premature decomposition, and/or appropriate reactivity with co-precursors to produce the target product under prescribed process conditions. The pressure and temperature in the reaction chamber can be selected to control the reaction process. In general, precursors with relatively low vapor pressures may be introduced using flow of vapor, aerosol, and/or direct liquid injection into a vaporization chamber. Flash evaporators can be used to introduce a controlled amount of precursor vapors into the reaction chamber to correspondingly control the reaction process in the chamber. The secondary reactant to drive hydrolysis/oxidation can be introduced through a separate inlet into the chamber. Commercial CVD apparatuses can be adapted for this use or specific equipment can be used. To facilitate deposition the substrate may be heated or may be cooled depending on the precursor properties. Inert gases such as $N_2$, Ar or the like may be used in appropriate capacities as carrier gases, purge gases, or pressure modulating gases in both sequential and continuous flow regimes.

If vapor deposition methods are desired, then the organotin precursors can be selected for desired properties amenable to the deposition, such as volatility and reactivity, through selection of radiation sensitive ligand (alkyl groups) and the hydrolytically sensitive and/or oxidizable ligands. Examples of suitable compositions are similar to those described above for formation of organotin solutions, for example precursor compositions to form the radiation sensitive coatings can comprise one or more compounds represented by $R_nSnX_{4-n}$ where n=1, 2, or 3, in which R is a hydrocarbyl group with 1-31 carbon atoms, such as described above, and X is an oxidizable ligand and/or is a ligand with a hydrolysable M—X bond, and mixtures thereof. The vapor deposition process can be controlled to provide a desired coating thickness.

For solution based deposition, the thickness of the coating generally can be a function of the precursor solution concentration, viscosity, and process parameters, such as the spin speed. For other coating processes such as vapor deposition, the thickness can generally also be adjusted through the selection of the deposition and coating parameters such as flow rate, cycle time, number of cycles, etc. In some embodiments, it can be desirable to use a thin coating to facilitate formation of small and highly resolved features.

In some embodiments, the coating materials can have an average dry thickness prior to development of no more than about 1 micron, in further embodiments no more than about 250 nanometers (nm), in additional embodiments from about 1 nanometers (nm) to about 100 nm, in further embodiments from about 1 nm to about 50 nm, in other embodiments from about 1 nm to about 40 nm and in some embodiments from about 1 nm to about 25 nm. The ranges of post development coating thickness for the exposed regions generally fall within the same ranges as presented above with the realization that development may remove a relatively small amount of exposed material. Generally, for multiple patterning processes, each coating layer of radiation patternable compositions can fall within these dry thickness ranges. In multiple patterning processing, subsequent patternable coatings can have the same average thickness or a different average thickness relative to previous patternable coatings. A person of ordinary skill in the art will recognize that additional ranges of solution concentrations and thicknesses within the explicit ranges above are contemplated and are within the present disclosure. The thickness can be evaluated using non-contact methods of x-ray reflectivity and/or ellipsometry based on the optical properties of the film. For subsequent radiation patternable layers over a previously patterned layer, the average thickness is evaluated relative to the existing patterned surface extending upward from the surface relative to the plane of the structure, acknowledging that the subsequent layer generally may not be flat.

For multiple patterning with a positive tone resist for cutting an initial pattern, the positive tone resist can effectively be an organometallic photoresist, such as a same or similar resist as used for an initial negative tone patterning, or an organic positive tone resist can be used, such as a blend of diazonaphthoquinone (DNQ) and novolac resin (a phenol formaldehyde resin), DNQ-Novolac resists. Commercial formulations of these positive tone resists are available, such as Fujifilm Holdings America Corp.

After deposition and formation of an organotin coating or other organometallic coating, an edge bead removal (EBR) rinse step generally can be used. EBR processing typically occurs prior to any thermal processing or baking following deposition of the photoresist and involves rinsing the peripheral edge of a wafer or substrate with a solvent to remove the photoresist in selected regions. An EBR and backside rinse involves applying the edge bead rinse solution to the edge as well as the back of the wafer, as described in Waller et al. U.S. Pat. No. 10,627,719, entitled "Methods of Reducing Metal Residue in Edge Bead Region from Metal-Containing Resists", incorporated herein by reference.

A soft bake, or a post-apply bake (PAB) is typically performed prior to radiation exposure to hydrolyze the hydrolysable bonds in the precursor compositions, and/or further drive off solvent, and promote densification of the coating material. In some embodiments, the PAB can be performed at temperatures from about 25° C. to about 250° C., in additional embodiments from about 50° C. to about 200° C. and in further embodiments from about 80° C. to about 150° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PAB temperatures and times within the explicit ranges above are contemplated and are within the present disclosure. In embodiments of particular interest, the coated material generally comprises a polymeric metal oxo-hydroxo network based on the binding of oxo-hydroxo ligands to the metals in which the metals also have some organic (hydrocarbyl) ligands, or a molecular solid comprised of polynuclear metal oxo-hydroxo species with organic (hydrocarbyl) ligands.

Patterning and Development

Generally, selected organometallic photoresist coatings can be patterned using radiation. Suitable radiation sources include extreme ultraviolet (EUV), ultraviolet (UV), or electron beam (EB) radiation. For fabrication of semiconductor devices, EUV radiation can be desirable due to its higher resolution compared to UV radiation, and its higher throughput compared to electron beam (EB)-based processing. Radiation can generally be directed to the substrate material through a mask or a radiation beam can be controllably scanned across the substrate to form a latent image within the resist coating. In this section, the general principles of patterning organometallic coatings are described to form patterned metal oxide based material, and specific processing for multiple patterning is described in the following section.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light has been used for lithography at 13.5 nm, and this light is generated from a Xe or Sn plasma source excited using high energy lasers or discharge pulses. Commercial sources of EUV photons include scanners fabricated by ASML Holding N.V. Netherlands. Soft x-rays can be defined from greater than or equal 0.1 nm to less than 10 nm. The light is directed through a mask to form a latent image in the radiation sensitive coating with exposed regions and un-exposed regions.

The amount of electromagnetic radiation can be characterized by a fluence or dose which is obtained by the integrated radiative flux over the exposure time. In some embodiments, suitable radiation fluences can be from about 1 mJ/cm$^2$ to about 200 mJ/cm$^2$, in further embodiments from about 2 mJ/cm$^2$ to about 150 mJ/cm$^2$ and in further embodiments from about 3 mJ/cm$^2$ to about 100 mJ/cm$^2$. In an embodiment, the EUV radiation can be done at a dose of less than or equal to about 150 mJ/cm$^2$ or with an electron beam at a dose equivalent to or not exceeding about 2 mC/cm$^2$ at 30 kV. A person of ordinary skill in the art will recognize that additional ranges of radiation fluences within the explicit ranges above are contemplated and are within the present disclosure.

Following exposure to radiation and the formation of a latent image, a subsequent post-exposure bake (PEB) is typically performed. The timing of a PEB in the context of multiple pattering is described below. In some embodiments, the PEB can be performed in ambient environments, and in additional embodiments the PEB can be performed in the presence of a reactive gas such as H$_2$O, CO$_2$, CO, SO$_2$, H$_2$, or others as described in U.S. patent application Ser. No. 17/188,679 to Telecky et al. (hereinafter the '679 application), entitled "Process Environment For Inorganic Resist Patterning," incorporated herein by reference. In some embodiments, the PEB can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure. The PEB can be designed to further densify and/or consolidate the exposed regions without decomposing the un-exposed regions into a metal oxide.

Following performing a PEB, development of the image involves the contact of the patterned coating material including the latent image to a developer composition to remove either the un-irradiated coating material to form the negative image or the irradiated coating to form the positive image, and other organometallic patterning materials may or may not be suitable for both types of patterning tones. Using the organotin resist materials described herein, effective negative patterning or positive patterning can be performed with desirable resolution using appropriate developing solutions, generally based on the same coating formed from the same precursor composition, although optimization of the coatings may suggest some adjustment of the compositions. In particular, the irradiated regions are at least partially condensed to increase the metal oxide character so that the irradiated material is resistant to dissolving by organic solvents while the un-irradiated compositions remain soluble in the organic solvents. Reference to a condensed coating material refers to at least partial condensation in the sense of increasing the oxide character of the material relative to an initial material. On the other hand, the un-irradiated material is not soluble in weak aqueous bases or acids due to the hydrophobic natural of the material so that aqueous bases can be used to remove the irradiated material while maintaining the non-irradiated material for positive patterning.

For positive tone imaging, suitable developers generally can be aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable positive tone developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent. Furthermore, mixed quaternary tetraalkyl-ammonium hydroxides can be used. In general, the developer can comprise from about 0.5 to about 30 weight percent, in further embodiments from about 1 to about 25 weight percent and in other embodiments from about 1.25 to about 20 weight percent tetra-alkylammonium hydroxide or similar quaternary ammonium hydroxides. A person of ordinary skill in the art will recognize that additional ranges of developer concentrations within the explicit ranges above are contemplated and are within the present disclosure.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, aromatic compounds (e.g., benzene, xylenes, toluene), esters (e.g., propylene glycol monomethyl ester acetate (PGMEA), ethyl acetate, ethyl lactate, n-butyl acetate, butyrolactone), alcohols (e.g., 4-methyl-2-pentanol, 1-butanol, isopropanol, 1-propanol, methanol), ketones (e.g., methyl ethyl ketone, acetone, cyclohexanone, 2-heptanone, 2-octanone), ethers (e.g., tetrahydrofuran, dioxane, anisole) and the like. Improved developer compositions have been described in published U.S. Patent Application No.: 2020/0326627 to Jiang et al., entitled "Organometallic Photoresist Developer Compositions and Processing Methods," incorporated herein by reference. Improved developer solutions generally comprise a reference organic solvent composition and an additive composition having a higher polarity and/or hydrogen-bonding character than the reference solvent composition. In one example, an improved developer composition can comprise PGMEA and acetic acid. The development can be performed for about 5 seconds to about 30 minutes, in further embodiments from about 8 seconds to about 15 minutes and in addition embodiments from about seconds to about 10 minutes. A person of ordinary skill in the art will recognize that additional ranges within the explicit ranges above are contemplated and are within the present disclosure.

Following development, it may be desirable to perform a freeze step, such as a hard bake, on the newly formed resist pattern to drive off remaining developer solution and to improve the fidelity of the patterned lines. Such a post development bake step can be used as a freeze step in a multiple patterning context, as described further below. In general, the hard bake conditions can be similar to the PEB step. In some embodiments, the hard bake can be performed in ambient environments, and in additional embodiments the PEB can be performed in the presence of a reactive gas such as $H_2O$, $CO_2$, CO, $SO_2$, $H_2$, or others as described in the '679 patent application cited above. In some embodiments, the hard bake can be performed at temperatures of at least about 45° C., in some embodiments from about 45° C. to about 400° C., in additional embodiments from about 50° C. to about 300° C. and in further embodiments from about 60° C. to about 250° C. The hard bake can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure. In some multiple patterning process embodiments, it may be desirable to limit, avoid or delay a post-development bake step to provide for further development of an initial pattern during a subsequent patterning step.

Multiple Patterning

After the formation of an initial pattern of organometallic material on a surface, another layer of organometallic photoresist can be deposited on top of the pattern. Due to the process advantages of the organometallic patterning compositions, generally an intervening processing step is not used to separate the subsequent patterning resist from the pre-patterned underlayers. Owing to the chemical changes that occur during exposure and/or PEB steps, existing patterns of organometallic photoresist are insoluble in the coating compositions. This property of the photoresist enables patterning approaches that would require more complicated processing for conventional polymer resists with methods known by those of ordinary skill in the art.

For example, to double pattern using a conventional resist one would have to transfer the resist pattern into another medium, such as a litho-etch lito-etch (LELE) process or by using a spacer-aligned patterning approach. In a typical LELE process, a first photoresist pattern is transferred into a hardmask layer, which is generally initially unpatterned, whereupon a second lithography process is performed to form a second photoresist pattern whereupon a second etch is performed to transfer the second pattern into the hardmask. By combining two patterns of lesser pitch, the final pattern in the hardmask can be of smaller pitch than the original photoresist pattern. In a general spacer-aligned process, such as in a spacer-aligned double patterning (SADP) process, a spacer material having a higher etch resistance than the photoresist material is conformally deposited onto the initial photoresist pattern and then the whole substrate is subjected to a series of etches to first remove a portion of the spacer material such that only the sidewalls remain whereupon the remaining photoresist pattern is stripped, thereby forming a pattern of spacer material having a smaller pitch than the initial resist pattern. Such a process requires multiple processing steps to achieve, and each step adds cost, complexity, and increases the chance for defect formation.

Figure 1B:
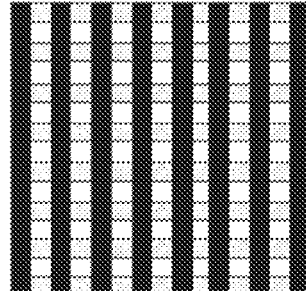
FIG. 1B is a representation of a crossed array (cross-hatched) pattern which may be formed via the metal oxide-freezing-metal oxide process disclosed herein.
Figure 1C:
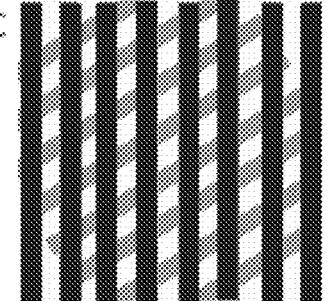
FIG. 1C is a representation of a hexagonal array pattern which may be formed via the metal oxide-freezing-metal oxide process disclosed herein.
Figure 1D:
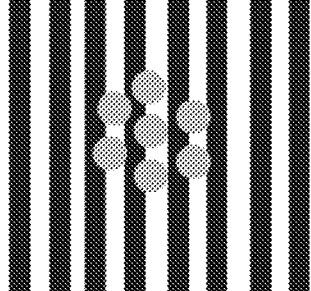
FIG. 1D is a representation of a mixed pattern of pillars and line-spacing which may be formed via the metal oxide-freezing-metal oxide process disclosed herein.

The multiple patterning concepts herein generally involve sequential patterning steps with a selected relationship of a subsequent pattern with a first pattern. These relationships are shown schematically in FIG. 1A-E. In FIG. 1A, the second pattern is developed to form features between the features of the first pattern so that feature spacing is effectively reduced. As shown in this figure, the patterns are regularly spaced stripes. Referring to FIG. 1B, the second pattern overlaying the first pattern intersects with the first pattern and, in this specific embodiment, is orthogonal to the first pattern. Each pattern depicted in FIG. 1B is again a series of regularly spaced stripes. Referring to FIG. 1C, the second pattern overlaying the first pattern has features at an angle to the first pattern, and the features of both patterns are regularly spaced stripes. For the multiple patterning structures in FIGS. 1A-C, the stripes can be made with irregular spacing or different shapes can be used relative to stripes within the feature size and spacing constraints of the patterning process. Referring to FIG. 1D, the second pattern has a different character from the first pattern with some portions again between the features of the first pattern and some portions overlapping the features of the first pattern.

Figure 1E:
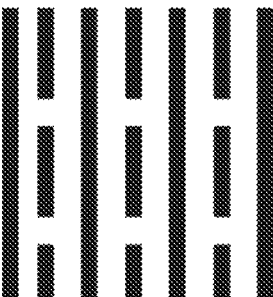
FIG. 1E is a representation of a line cutting pattern which may be formed via a double patterning process disclosed herein.

FIG. 1E depicts a cutting of the first pattern using a second patterning step. The cuts of the first pattern are guided by the second pattern. The cutting process can be effectively performed using opposite tone patterning for each step. The second resist coating layer is fully stripped off after doing the cutting step and prior to performing further processing.

While the discussion herein focuses primarily on two patterning steps, a third or more patterning steps can be sequentially performed. These three or more patterning steps can be straightforward generalizations of the multiple patterning formats in FIGS. 1A-E. A cutting step of FIG. 1E can be interspersed between other multiple patterning steps or can be the ultimate steps that cuts through one or more previous patterns to form a cut pattern. The division of a target overall pattern into sequential patterns with a plurality of masks can be a complex procedure, and systematic approaches for dividing such masks are described, for example, in U.S. Pat. No. 9,679,095 to Li et al., entitled "Layout Decomposition for Multiple Patterning Lithography," and published U.S. patent application 2015/0040083 to Cheng et al., entitled "System and Method for Decomposition of a Single Photoresist Mask Pattern Into 3 Photoresist Mask Patterns," both of which are incorporated herein by reference.

The desirable processing approaches described herein provide for effective multiple patterning without intervening pattern transfer based on high etch contrast and optimization of pattern development. Thus, multiple patterning can be performed using fewer steps than may be used for multiple patterning with organic resists. Generally, the lower pattern or patterns are based on negative tone patterning. The irradiated resist is maintained while non-irradiated resist is removed by the developer. Subsequent layers or resist can then be deposited without having the solvent for the resist damaging the initial pattern. After development of a pattern, a post-patterning freeze step, i.e., a bake step, can optionally be performed to stabilize the pattern, and such a freeze step can generally be desirable to improve the overall patterning quality following the multiple patterning steps. A cut step can be performed using a positive tone pattern step such that the developer removes both the irradiated resist composition as well as exposed portions of the pervious patterns. The positive tone patterning for cutting can be performed with an organometallic patterning composition or an organic resist, which can be a chemically amplified resist (CAR). High pattern contrast makes this a reasonable undertaking without pattern transfer.

Thus for multiple patterning as depicted in FIGS. 1A to 1D, a litho-freeze-litho-freeze (LFLF) process (with freeze steps being optional and/or adjustable) enables a simpler processing scheme to achieve more complex, higher density, or improved patterns relative to single patterning approaches, and enables simpler processing schemes relative to other multiple patterning approaches available with conventional resists. In embodiments of particular interest, the current processing takes advantage of a hardmask over the substrate that provides for more applicability without being constrained by the substrate compositions. During processing of complex structures, there can be many layers of materials built up and patterned so that the composition of the top surface of the substrate at the start of a patterning step can be varied.

Figure 2A:
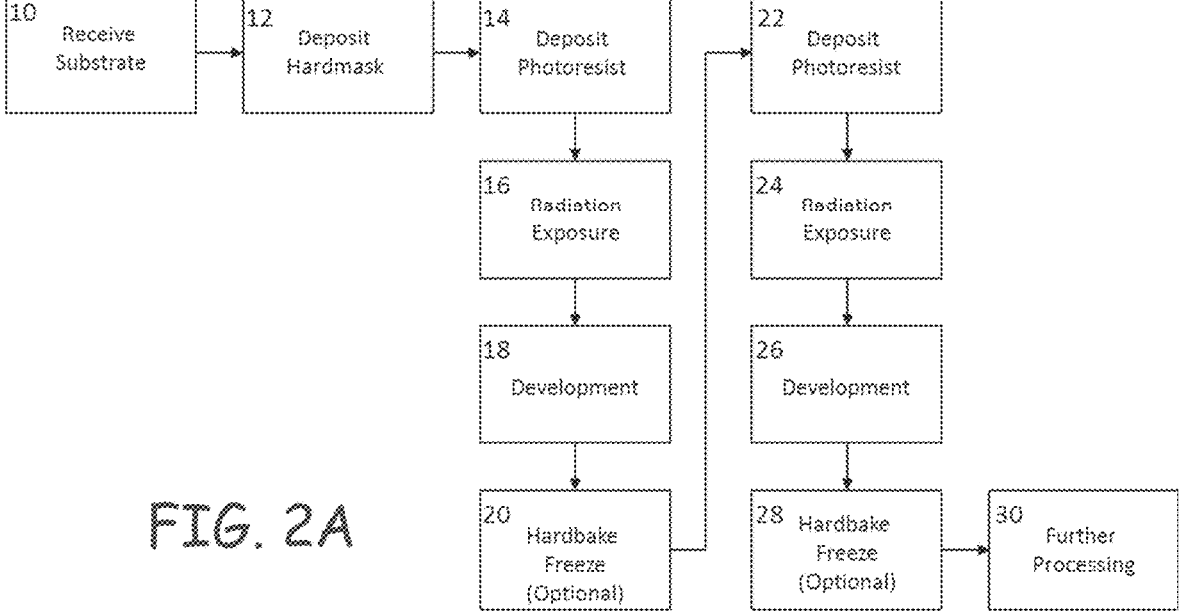
FIG. 2A is a flow chart of the litho-freeze-litho-freeze process.

FIG. 2A shows a flow chart of the LFLF process. Referring to FIG. 2A, to initiate the process, a substrate is obtained 10, and a hardmask layer is placed 12 over the substrate. Two lithography processes are shown as parallel vertical arrays of steps. During the first lithography process, an organometallic photoresist is deposited 14 onto the substrate using methods as described above. The resist then receives patterned radiation exposure 16 and development 18 to form an image or pattern from a latent image. To further stabilize the pattern, the structure can be subjected optionally to a freeze 20 to allow a subsequent lithography step with reduced damage to the original developed pattern. A freeze can be performed using an after development bake step as described above and/or a further unpatterned UV irradiation step. The post-development UV irradiation can be used to fragment remaining carbon-metal bonds to further stabilize the material with respect to further processing. A blanket UV irradiation step can be performed in the same tool without a mask. A subsequent lithography process can then be performed without removing the developed pattern formed in first lithography process.

A second lithography process similarly comprises depositing 22 an organometallic photoresist over the frozen developed pattern of the first lithography process, radiation exposure 24 of the organometallic resist to form a second latent image, development 26 of the second latent image, and optionally performing a second hardbake freeze 28 to stabilize the pattern following the second development. Still more litho-freeze processes, such as shown in the parallel set of steps in FIG. 2A, can be performed until a desired pattern of organometallic photoresist is obtained. Once patterning is completed, further processing 30 into devices can be performed. By simplifying the process for performing two or more lithography steps, device manufacturing can be made more efficient.

Figure 2B:
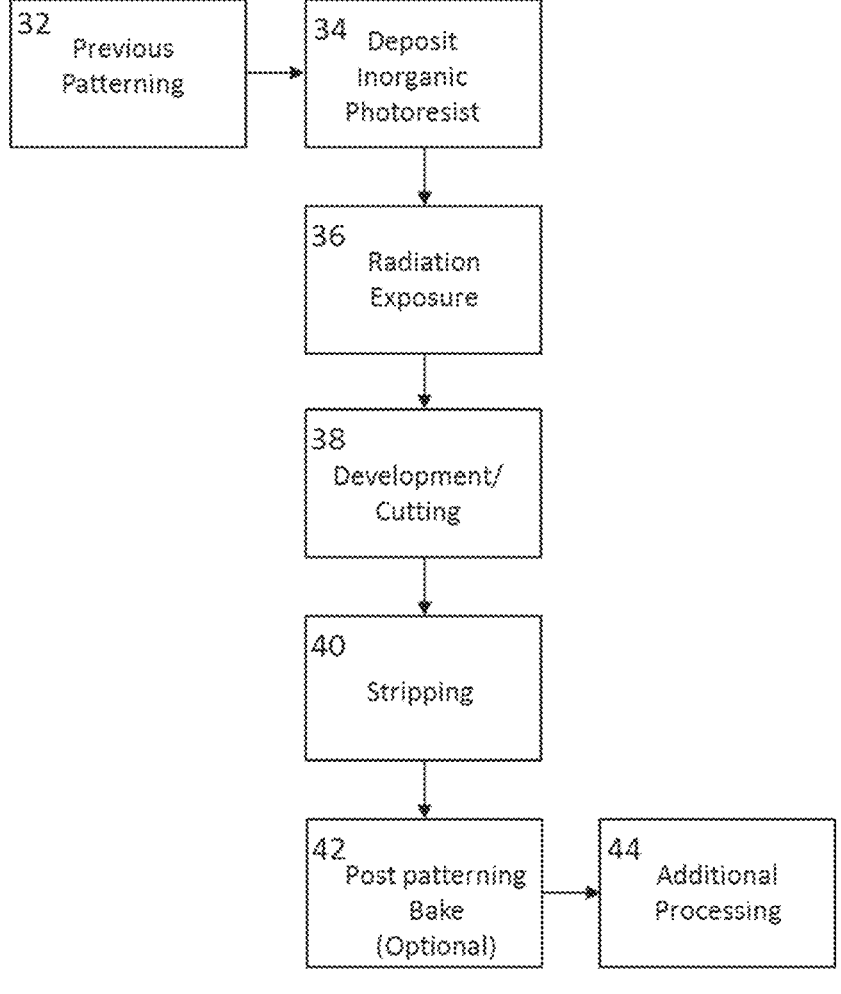
FIG. 2B is a flow chart of a lithographic cutting process.

A cut step is similar to the lithography steps of FIG. 2, except that the unexposed resist is removed following the cut step prior to an optional hardbake and further processing, either additional lithography steps or next steps of device formation. A cutting process is shown in FIG. 2B. After previous patterning 32 is completed, organometallic photoresist is deposited 34. The resist layer is then exposed 36 with patterned radiation to form a latent image. The latent image is developed 38 as a positive tone resist. In the cutting process, the development 38 can be effective to remove the irradiated resist as well as exposed regions of the underlying patterned resist formed from irradiated resist from earlier lithographic patterning steps. Thus, the process step 38 involves simultaneous development and cutting. Following development/cutting 38, unexposed resist is stripped 40. Following stripping 40, an optional post patterning bake can be performed 42 to stabilize the pattern. Additional processing can then be performed 30.

Figure 3:
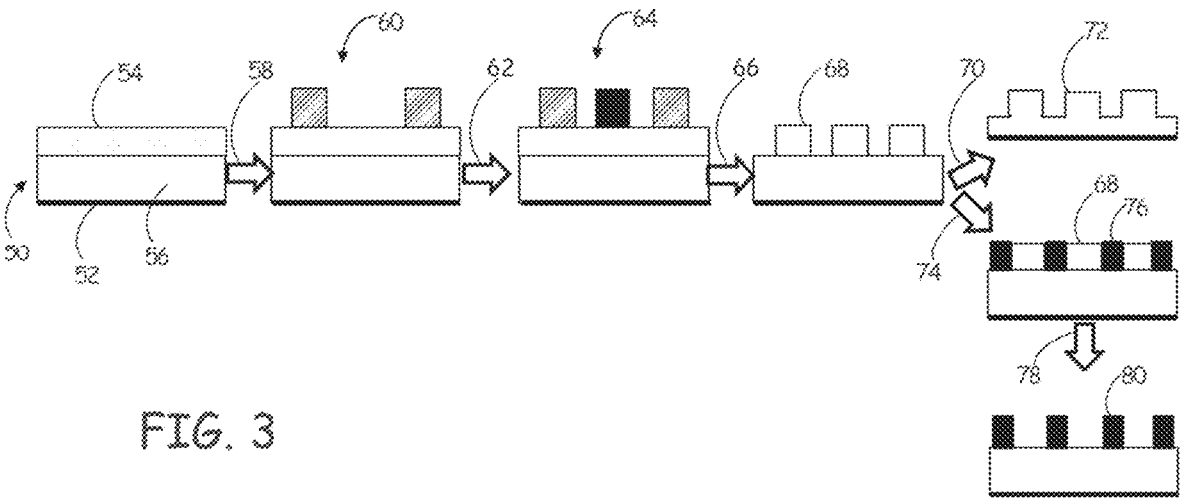
FIG. 3 is a side plan view of a "thermal freeze" double patterning process flow in which a bake renders the first patterned layer insoluble to a second layer.

A double patterning process with a "thermal freeze" is outlined in FIG. 3. An initial structure 50 comprises a substrate 52 with a hardmask coating 54. Substrate 52 comprises an upper section 56 that can be subject to processing and that may or may not have distinct compositions and or patterning of its own. In a first stage of processing 58, a first pattern 60 is formed over hardmask 54. The patterning stage involves several steps as outlined in FIG. 2 in the context of the first vertical column of steps to form a first pattern. Then, a second patterning stage is performed 62 to form a second pattern 64 over hardmask 54. While FIG. 3 depicts a second pattern within the first pattern to form a higher resolution overall pattern, the second pattern can be any of the types depicted in FIGS. 1A-1E. Additional patterning stages can be performed, and in the context of the overall process, second pattern 64 can be considered to be a final pattern.

Once a second or final pattern 64 is formed, the pattern can be further processed 66 by transferring the overall pattern to hard mask 54 and stripping the remaining resist to form patterned hardmask 68. Then, the hardmask pattern is transferred to upper section 56 of substrate 52. Pattern transfer to upper section 56 can comprise etching 70 to form etched substrate 72 or deposition 74 to form patterned hardmask 68 with accretions 76 followed by hardmask etching 78 to form patterned substrate 80.

Note that it is straightforward to extend this process to multiple coat and pattern steps, and such extensions are contemplated and are within the present disclosure. With respect to multiple patterning, a significant difference between the inorganic coating materials described herein and conventional organic resists is that organic resists remain soluble in conventional resist casting solvents even after a thermal bake. The resist materials described herein can be condensed with a thermal bake such that they are not soluble in organic solvents and subsequent coating layers can be applied.

Some examples of useful applications of this invention include combining two distinct patterns that require different illumination conditions, for example combing a pillar pattern with a line-space pattern. Other advantages of this invention can provide stitching advantages for desired patterns wherein a portion of a desired pattern can be printed, followed by printing another portion of the pattern to print a full pattern that would otherwise be difficult to achieve in one lithography step. Multiple exposure mediums can also be practiced for this invention wherein multiple exposure steps independently chosen from sources, such as EUV, ArF, KrF, and electron beams can be used and their respective patterns combined into a new pattern that would otherwise be difficult or unachievable when using only one exposure source.

In some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. A person of ordinary skill in the art will recognize that additional ranges of pitch and average widths within the explicit ranges above are contemplated and are within the present disclosure.

In some embodiments, average line-width roughness can be no more than about 5.5 nm, in some embodiments no more than about 5 nm and in further embodiments no more than about 4.5 nm. As shown in the Examples, the line width roughness can be evaluated as a function of a critical dimension. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of line-width roughness within the explicit ranges above are contemplated and are within the present disclosure. A rinse can be performed to further remove some patterning defects and improve pattern fidelity, as described in published U.S. patent application 2020/0124970 to Kocsis et al., entitled "Patterned Organometallic Photoresists and Methods of Patterning," incorporated herein by reference.

After formation of the desired pattern using the methods herein, the resulting structure can be further processed as desired to achieve a functional integrated circuit.

Specific Multiple Patterning Embodiments

In general, the organometallic patterning resists provide a useful platform for effective multiple patterning with reduced process steps and good capability to exploit EUV processing. In this section, three multiple patterning scenarios are discussed in more detail with appropriate figures to provide more specific explanation for these representative embodiments of multiple patterning. First, a litho-freeze-litho-freeze process is described in which sequential negative tone patterning is performed, and generally with a freeze step based on thermal processing performed between the two patterning steps. While the freeze steps can be optional, they are generally desirable. Second, a litho (negative)-litho (positive/cut)-partial strip-freeze process is described, in which the positive tone development simultaneously cuts a portion of the first pattern. A freeze can be optionally performed after the first litho step. The partial strip step removes the remaining resist from the positive tone patterning after the cut step is completed to leave the uncut remaining portions of the first pattern that was formed by negative tone processing. In the third set of process steps, a pattern-pattern-litho process is performed, in which a radiation sensitive coating is exposed to two distinct mask patterns to form a composite latent image before performing a development step. The development then forms a composite pattern. These processes can also be combined in appropriate ways as discussed further following the discussion of the figures.

Figures 4, 5, 6, 7:
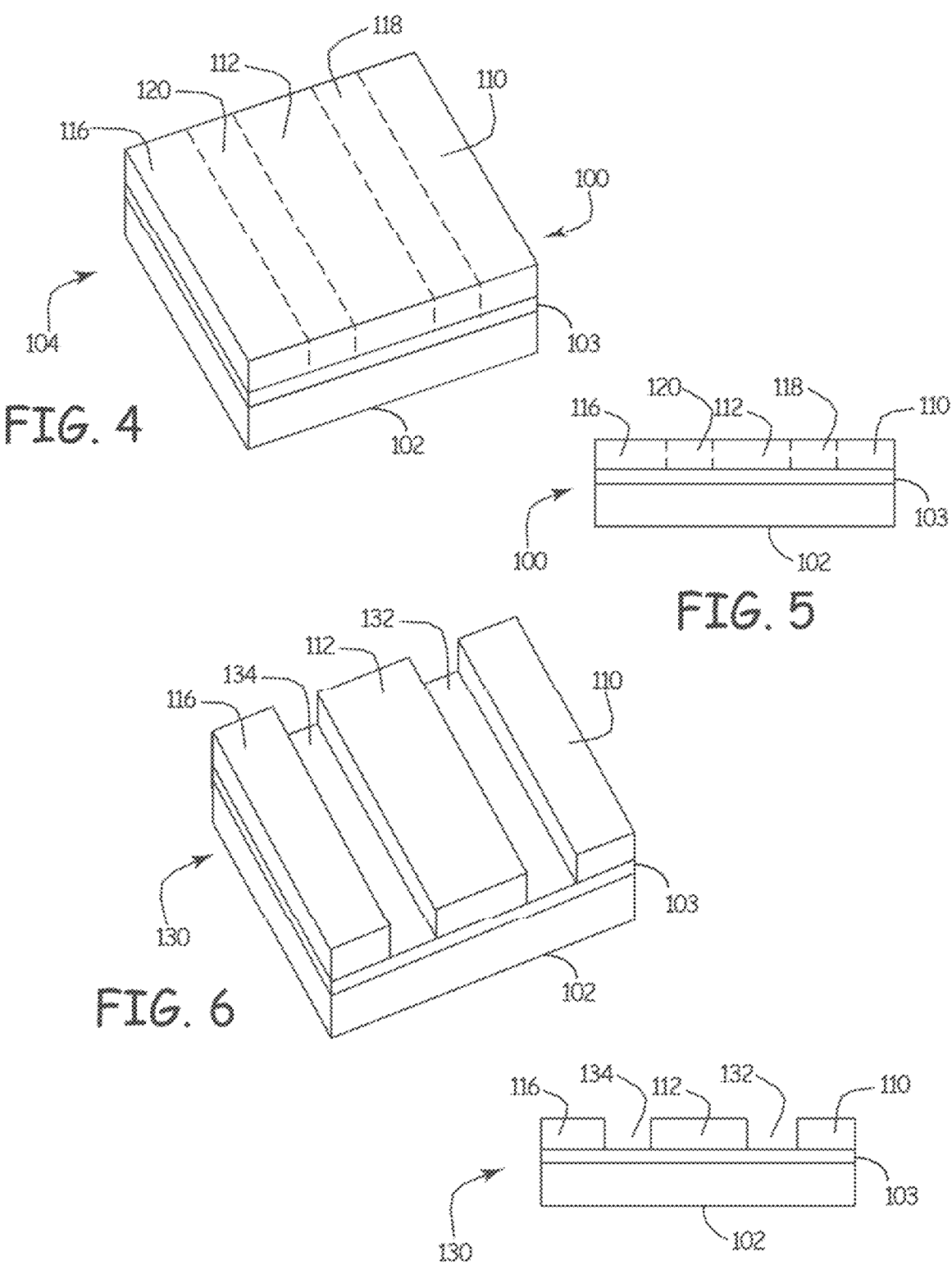
FIG. 4 is a schematic perspective view of a radiation patterned structure with a latent image.
FIG. 5 is a side plan view of the structure of FIG. 4.
FIG. 6 is a schematic perspective view of the structure of FIG. 4 after development of the latent image to remove un-irradiated photosensitive organometallic material to form a patterned structure.
FIG. 7 is a side view of the patterned structure of FIG. 6.

FIGS. 4 through 15 are directed to a litho-freeze-litho-freeze process with features from the second lithography step being placed within the pattern of the first lithography step. Following exposure with radiation, the first photosensitive organometallic material is patterned with irradiated regions and un-irradiated regions. Referring to FIGS. 4 and 5, a patterned structure 100 is shown comprising a substrate 102, a hardmask layer 103, and patterned organometallic material 104. Patterned organometallic material 104 comprises condensed regions 110, 112, 116 of irradiated coating material and uncondensed regions 118, 120 of un-irradiated coating material. The pattern formed by condensed regions 110, 112, 116 and uncondensed regions 118, 120 represent a latent image within the organometallic material, and the development of the latent image is discussed in the following section. The materials suitable for each of these layers is described in detail above, and the discussion above can be considered reproduced here verbatim.

Referring to FIGS. 6 and 7, the latent image of the structure shown in FIGS. 4 and 5 has been developed through contact with a developer to form patterned structure 130. Development compositions for negative tone development are described in detail above, and that discussion can be considered a part of the present discussion. After development of the image, hardmask layer 103 is exposed along the top surface through openings 132, 134. Openings 132, 134 are located at the positions of uncondensed regions 118, 120, respectively.

Figures 8, 9:
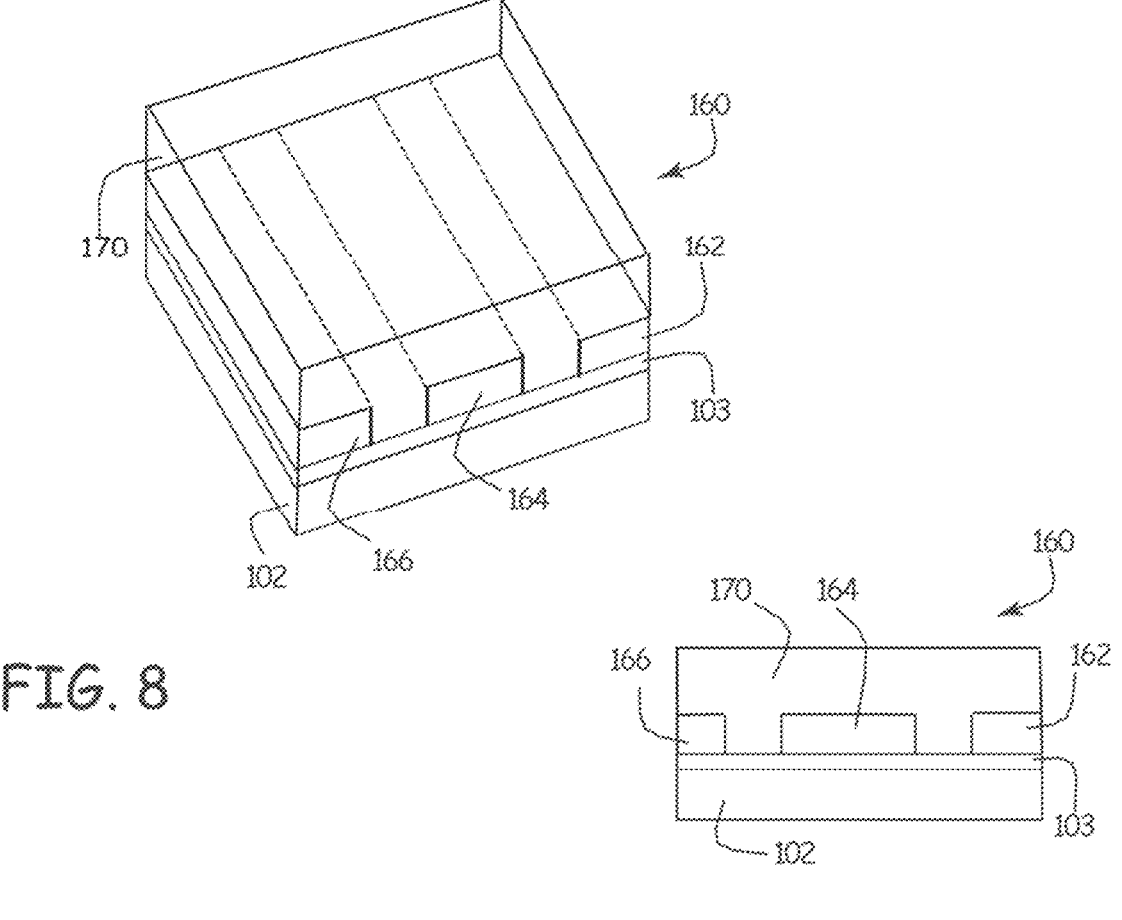
FIG. 8 is a schematic perspective view of the patterned structure of FIG. 6 onto which a second layer of photosensitive organometallic material has been deposited.
FIG. 9 is a side view of the structure of FIG. 8.

After a post-development hardbake heating of the patterned structure 130, the pattern of the organometallic material is chemically "frozen" and thus more insoluble and stable in the subsequent negative tone lithographic processes. Referring to FIGS. 8 and 9, a patterned structure 160 is shown comprising a substrate 102, a hardmask layer 103, "frozen" organometallic material 162, 164, 166, and a second photosensitive organometallic material 170, which has been deposited using solution deposition and/or vapor deposition approaches described above. The pattern formed by "frozen" regions 162, 164, 166 is retained under the second photosensitive organometallic material 170 regardless of the deposition approaches since the frozen regions are not soluble in the solvents used to deposit the photosensitive organometallic material. In general, the post-development bake to freeze the pattern is not required, but it does further stabilize the structure with efficient processing to improve the pattern structure.

Figures 10, 11:
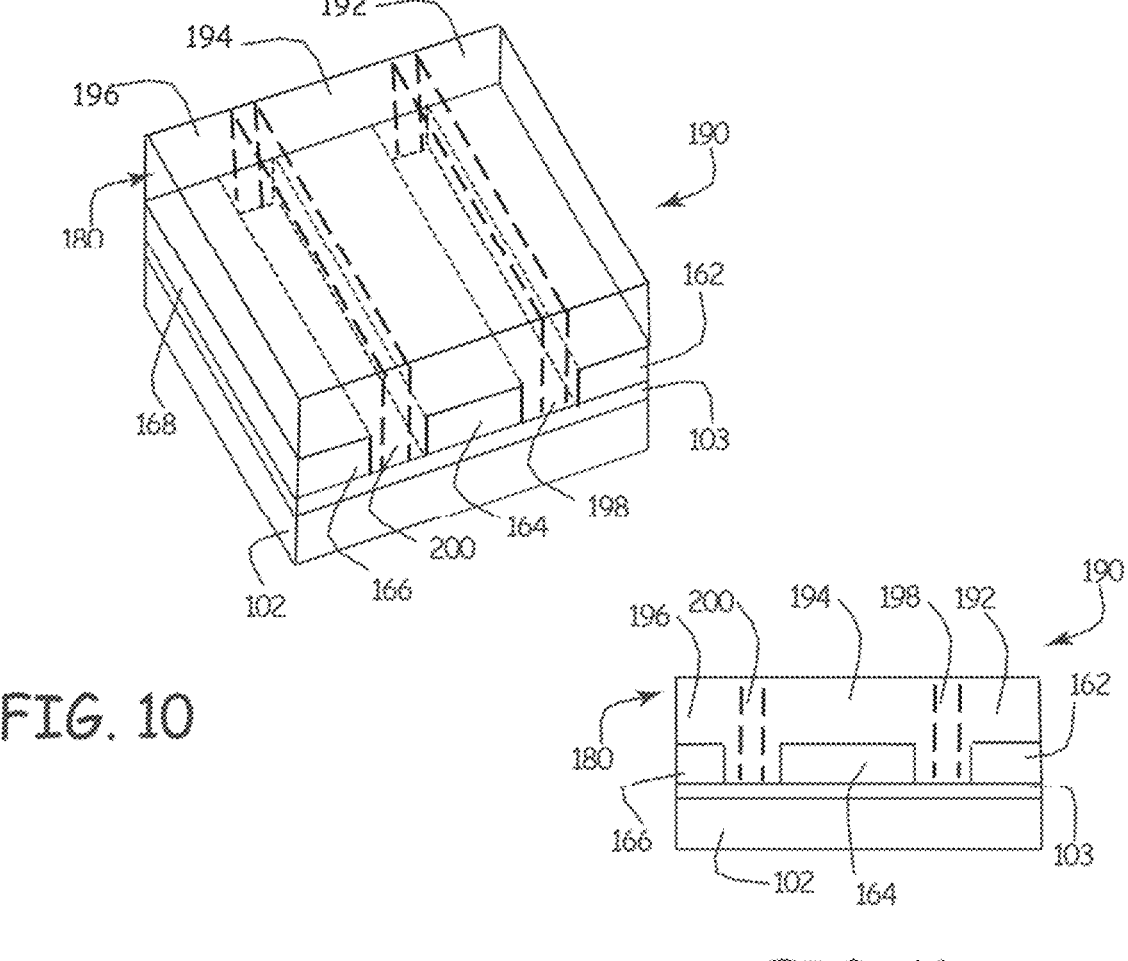
FIG. 10 is a schematic perspective view of the radiation patterned structure of FIG. 8 with a latent image in the second photosensitive organometallic layer which is parallel to the first pattern.
FIG. 11 is a side plan view of the structure of FIG. 10.

Following exposure with radiation, the second photosensitive organometallic material is patterned with irradiated regions and un-irradiated regions. Referring to FIGS. 10 and 11, a patterned structure 190 is shown comprising a substrate 102, a hardmask layer 103, "frozen" previous pattern of organometallic material 162, 164, 166, and patterned organometallic material 180. Patterned organometallic material 180 comprises regions 198, 200 of irradiated coating material and uncondensed regions 192, 194, 196 of un-irradiated coating material. The pattern formed by condensed regions 198, 200 is parallel to and offset from the pattern formed by the "frozen" organometallic material 162, 164, 166. The pattern formed by condensed regions 198, 200 and unirradiated regions 192, 194, 196 represents a latent image into the second organometallic material. The pattern is referred to as the second latent image.

Figures 12, 13:
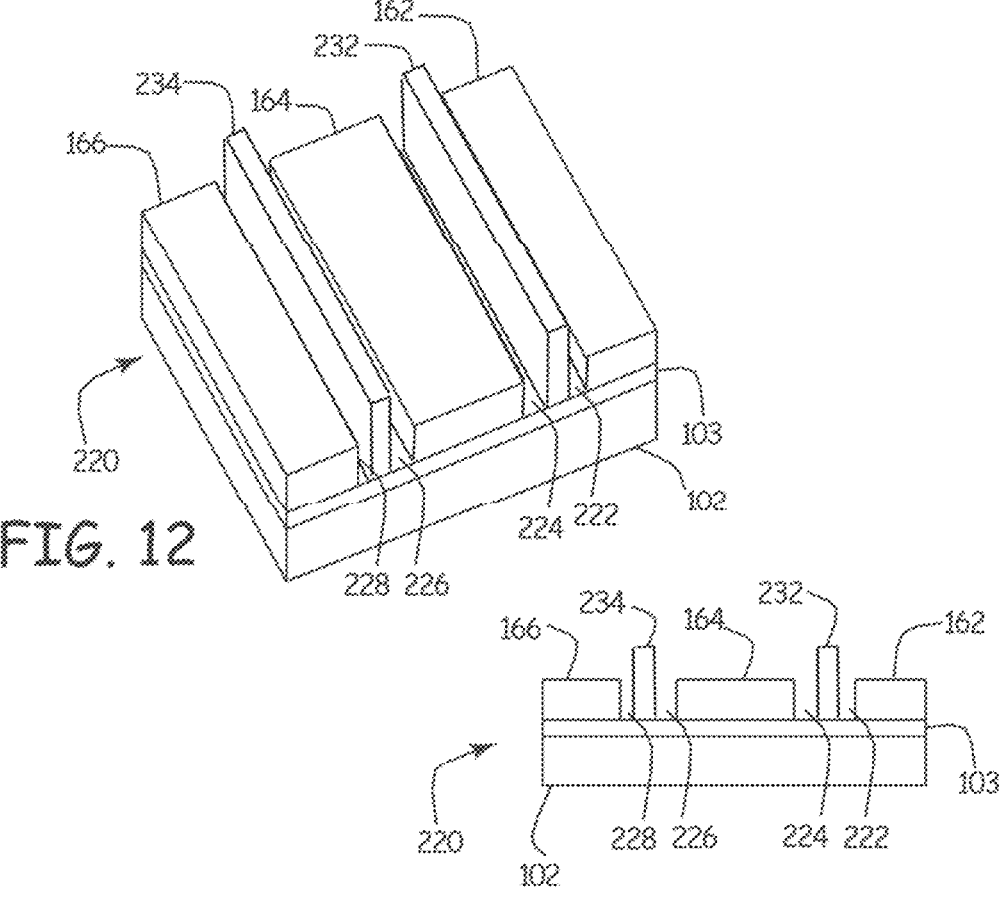
FIG. 12 is a schematic perspective view of the structure of FIG. 10 after development of the latent image to remove un-irradiated photosensitive organometallic material from the second photosensitive organometallic layer to form a double patterned line structure on the hardmask-coated substrate.
FIG. 13 is a side view of the structure of FIG. 12.

Referring to FIGS. 12 and 13, the second latent image of the structure shown in FIGS. 10 and 11 has been developed through contact with a developer for a negative tone image to form a double patterned line structure 220. After development of the second latent image, organometallic material 232, 234 is located at the positions of condensed regions 198, 200, respectively. "Frozen" organometallic material 162, 164, 166 is located at the positions of condensed regions 110, 112, 116, respectively. Hardmask layer 103 is exposed along the top surface through openings 222, 224, 226, 228.

Figures 14, 15:
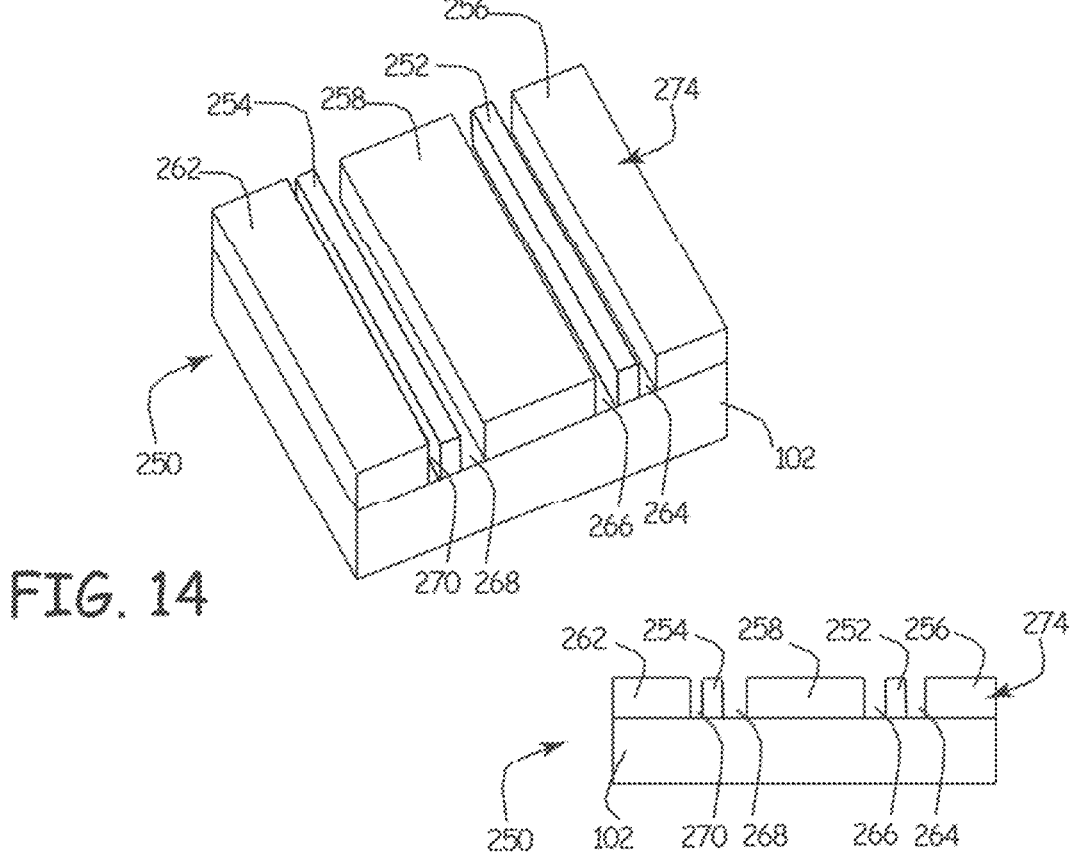
FIG. 14 is a schematic perspective view of a patterned structure having a hardmask which has been etched into a pattern according to the structure of FIG. 12.
FIG. 15 is a side view of the structure of FIG. 14.

Referring to FIGS. 14 and 15, the etched hardmask 274 exposes the substrate 102 along the top surface through openings 264, 266, 268, 270. The patterned substrate 250 consists of hardmask regions 252, 254, 256, 258, 262. The hardmask regions 252, 254, 256, 258, 262 correspond, respectively, to the positions of organometallic material 232, 234 and "frozen" organometallic material 162, 164, 166 shown in FIGS. 9 and 10. Further processing of patterned substrate 250 may include etching into substrate 102 through openings 264, 266, 268, 270 as depicted in FIG. 3, for example. Alternatively, or additionally, depositions can be delivered to the substrate through openings 264, 266, 268, 270, which can be performed with or without first etching the substrate.

Figures 16, 17:
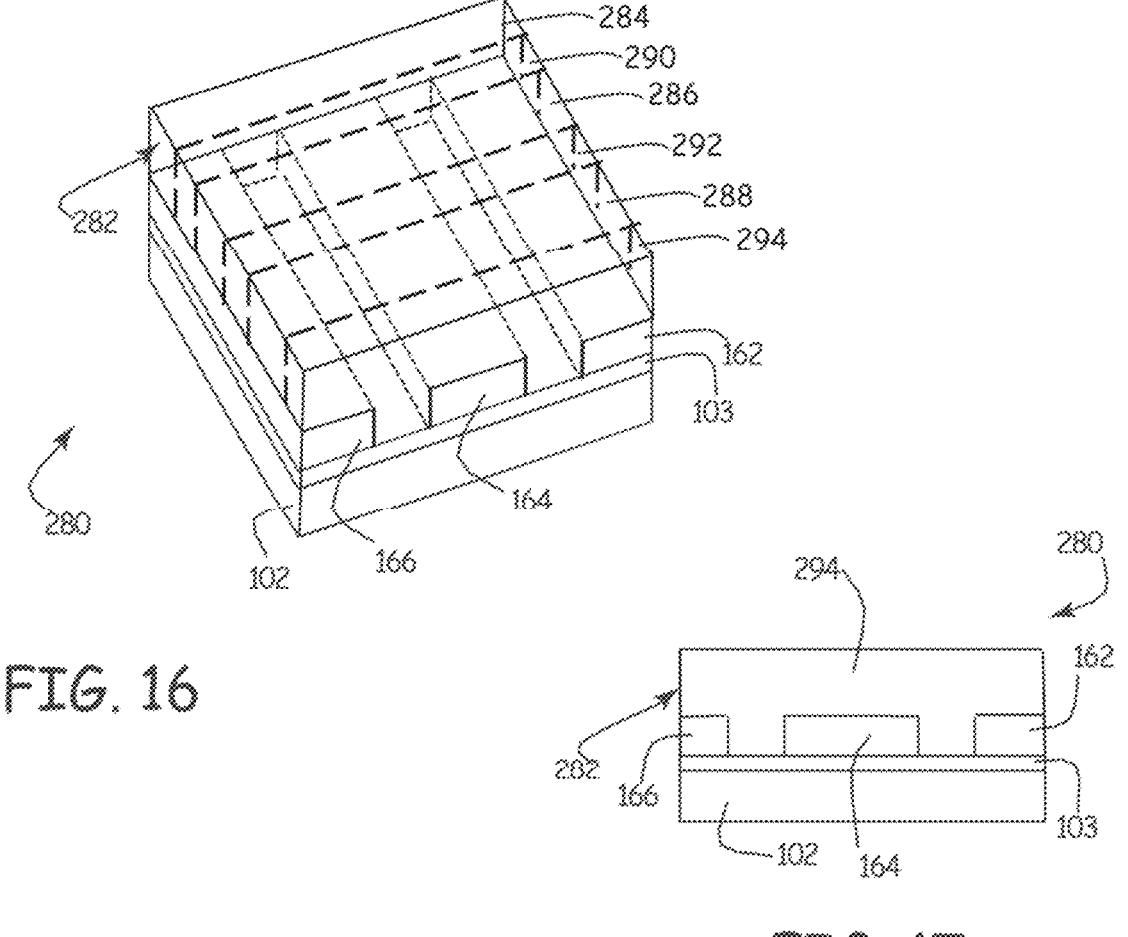
FIG. 16 is a schematic perspective view of the radiation patterned structure of FIG. 8 with a latent image in the second photosensitive organometallic layer which is perpendicular to the first pattern.
FIG. 17 is a side plan view of the structure of FIG. 16.

FIGS. 16-21 are directed to a litho-freeze-litho-freeze process with features from the second lithography step laying atop and perpendicular to the pattern of the first lithography step. FIG. 16 illustrates the exposure of patterned structure 160 (FIGS. 8 and 9) with radiation to pattern the second photosensitive organometallic material with irradiated regions and un-irradiated regions. Resulting patterned structure 280 is shown comprising a substrate 102, a hardmask layer 103, "frozen" organometallic material 162, 164, 166, and patterned organometallic material 282. Patterned organometallic material 282 comprises condensed regions 290, 292, 294 of irradiated coating material and regions 284, 286, 288 of un-irradiated coating material. The pattern formed by condensed regions 290, 292, 294 is perpendicular to the pattern formed by the "frozen" organometallic material 162, 164, 166. The pattern formed by condensed regions 290, 292, 294 and unirradiated regions 284, 286, 288 represents a latent image into the second organometallic material. The pattern is referred to as the second latent image. Referring to FIGS. 18 and 19A-19C, the second latent image of the structure shown in FIGS. 16 and 17 has been developed through contact with a developer for a negative tone image to form crosshatch patterned structure 310. After development of the second latent image, organometallic material 312, 314, and 316 is located at the positions of condensed regions 290, 292, 294, respectively. Portions of organometallic material 312, 314, and 316 are adjacent to and overlapping with, but does not cut "frozen" organometallic material 162, 164, 166. "Frozen" organometallic material 162, 164, 166 is located at the positions of condensed regions 110, 112, 116, respectively. Hardmask layer 103 is exposed along the top surface through openings 324, 326, 328, 330, 332, 334.

Figures 20, 21:
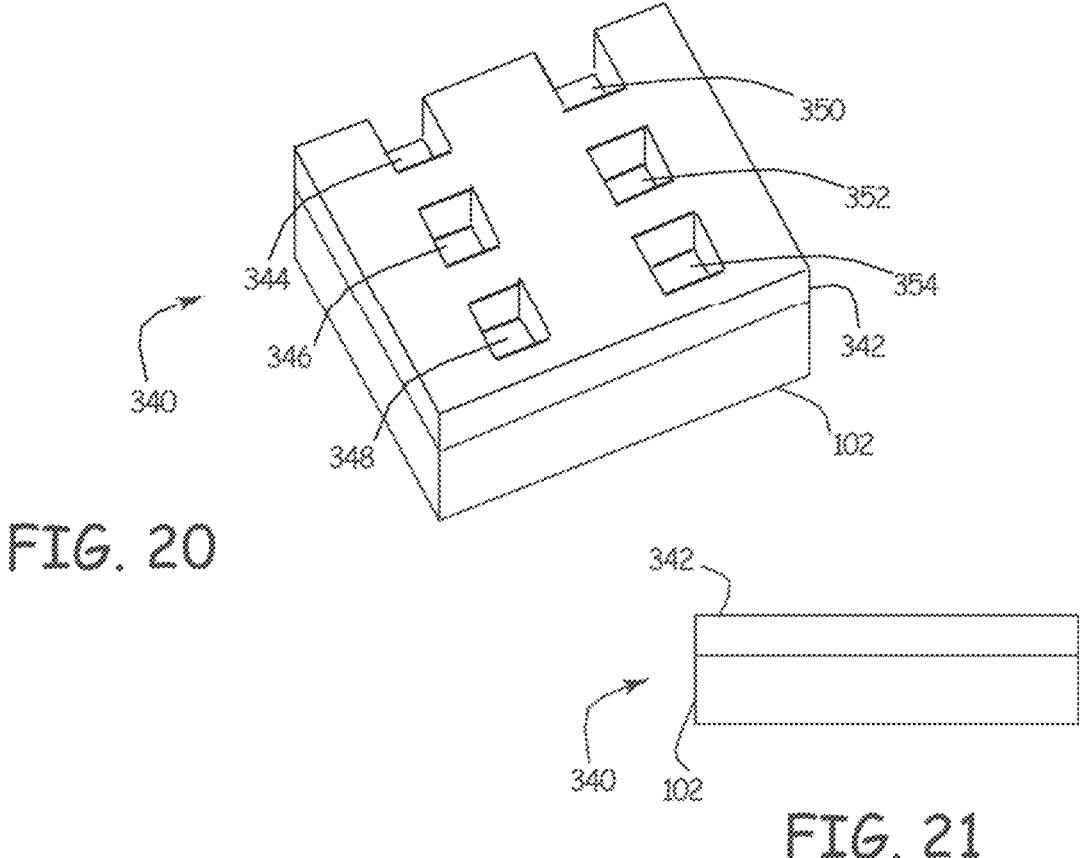
FIG. 20 is a schematic perspective view of a patterned structure having a hardmask which has been etched into a pattern according to the structure of FIG. 18.
FIG. 21 is a side plan view of the structure of FIG. 20.

After a hardbake heating of crosshatch patterned structure 310, the pattern of the organometallic material is chemically "frozen" and thus more insoluble and stable to subsequent processing. Referring to FIGS. 20 and 21, patterned substrate 340 consists of patterned hardmask 342 with a pattern corresponding to the positions of organometallic material 312, 314, and 316 and "frozen" organometallic material 162, 164, 166 shown in FIGS. 18 and 19A-19C. Patterned hardmask 342 exposes substrate 102 along the top surface through openings 344, 346, 348, 350, 352, 354. Further processing of patterned substrate 340 may include etching into substrate 102 through openings 344, 346, 348, 350, 352, 354 as depicted in FIG. 3, for example. Alternatively, or additionally, depositions can be delivered to the substrate through openings 344, 346, 348, 350, 352, 354, which can be performed with or without first etching the substrate.

Figures 22A, 22B, 22C, 22D, 22E, 22F:
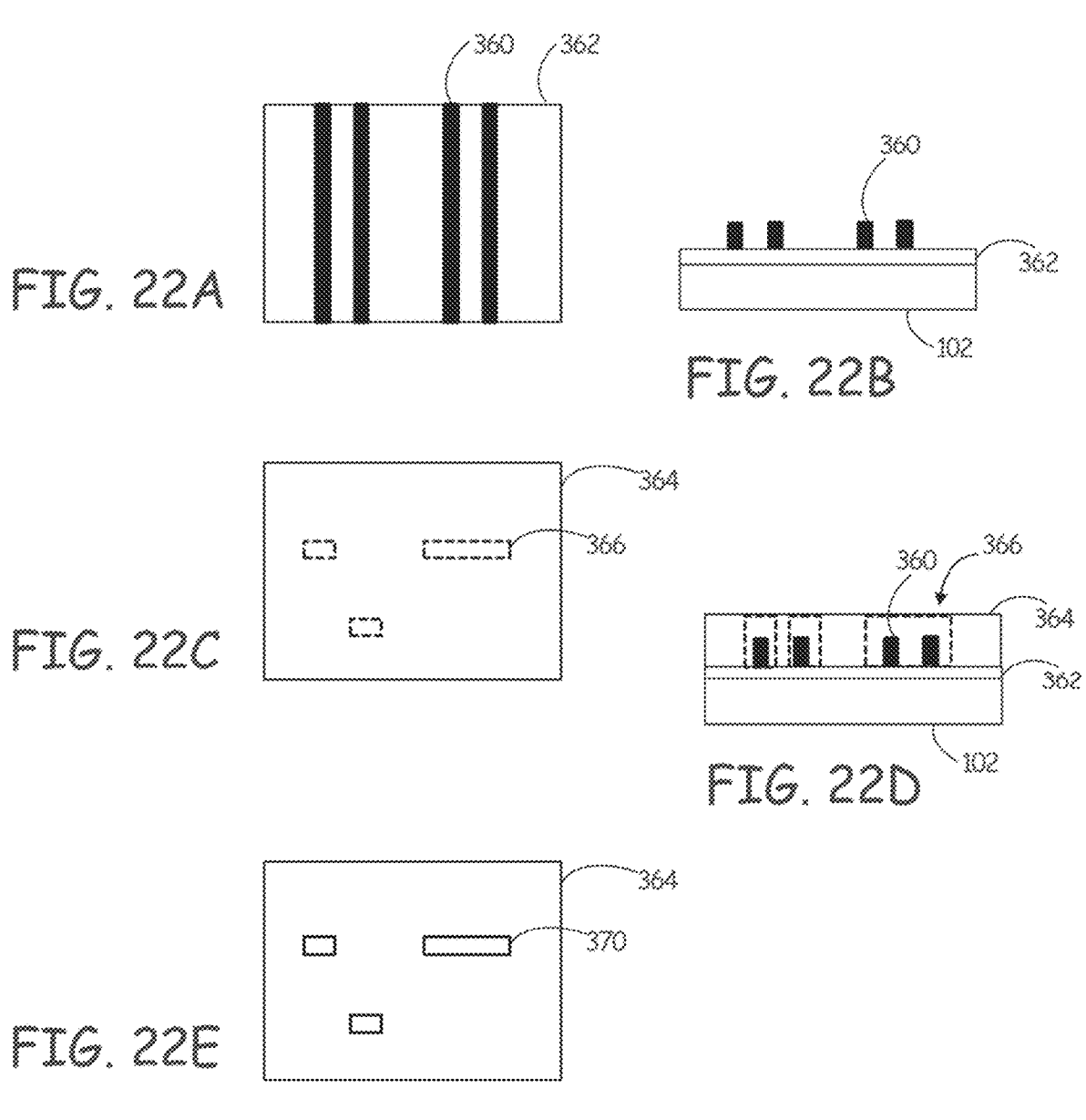
FIG. 22A is a schematic view of a patterned structure having organometallic material that has been exposed to patterned radiation and developed.
FIG. 22B is a side view of the structure of FIG. 22A.
FIG. 22C is a schematic view of the structure of FIG. 22A onto which a layer of photosensitive organometallic material has been deposited and patterned with radiation to form a latent image.
FIG. 22D is a side view of the structure of FIG. 22C.
FIG. 22E is a schematic view of the structure of FIG. 22C after development of irradiated organometallic material according to the latent image of FIG. 22C.
FIG. 22F is a schematic view of a line cut structure of FIG. 22A, shown after removing unirradiated photosensitive organometallic material from the organometallic layer of FIG. 22E.

FIGS. 22A-22F are directed to a litho-litho process with features from the second lithography step cutting the features from the first lithography step through the use of a positive tone patterning after a negative tone patterning step. FIGS. 22A and 22B show a patterned structure comprising organometallic material 360 in a pattern on hardmask layer 362. Generally, hardmask layer 362 is on a substrate 102. Organometallic material 360 is a first photosensitive organometallic material that has been irradiated and is at least partially condensed but may not have been subjected to a hardbake freeze. While a hardbake freeze step can stabilize the structure of FIG. 22A, a hardbake freeze can slow subsequent development to cut the structure. Organometallic material 360 has been developed through contact with a negative tone developer to form a pattern. In FIGS. 22C and 22D a second photosensitive organometallic material 364 has been deposited onto the patterned structure of FIGS. 22A and 22B using solution deposition and/or vapor deposition approaches described above and patterned with radiation to form a latent image with irradiated regions 366. In some embodiments, the first photosensitive organometallic material and the second photosensitive organometallic material can be the same material. Referring to FIG. 22E, irradiated regions 366 have been developed with a positive tone developer to form open regions 370. The positive tone developer also removes exposed organometallic material 360 in the same development step. With the removal of both the irradiated second photosensitive organometallic material and the exposed organometallic material 360, open regions 370 expose hardmask layer 362. Referring to FIG. 22F, unexposed second organometallic material 364 has been stripped to reveal patterned resist 376 on hardmask layer 362. Cuts 374 through patterned resist 376 correspond to open regions 370. Further processing of the patterned structure of FIG. 22D generally includes etching through hardmask layer 362 to expose portions of a substrate below hardmask layer 362. The remaining patterned organometallic material can then be stripped.

Figures 23A, 23B, 23C, 23D:
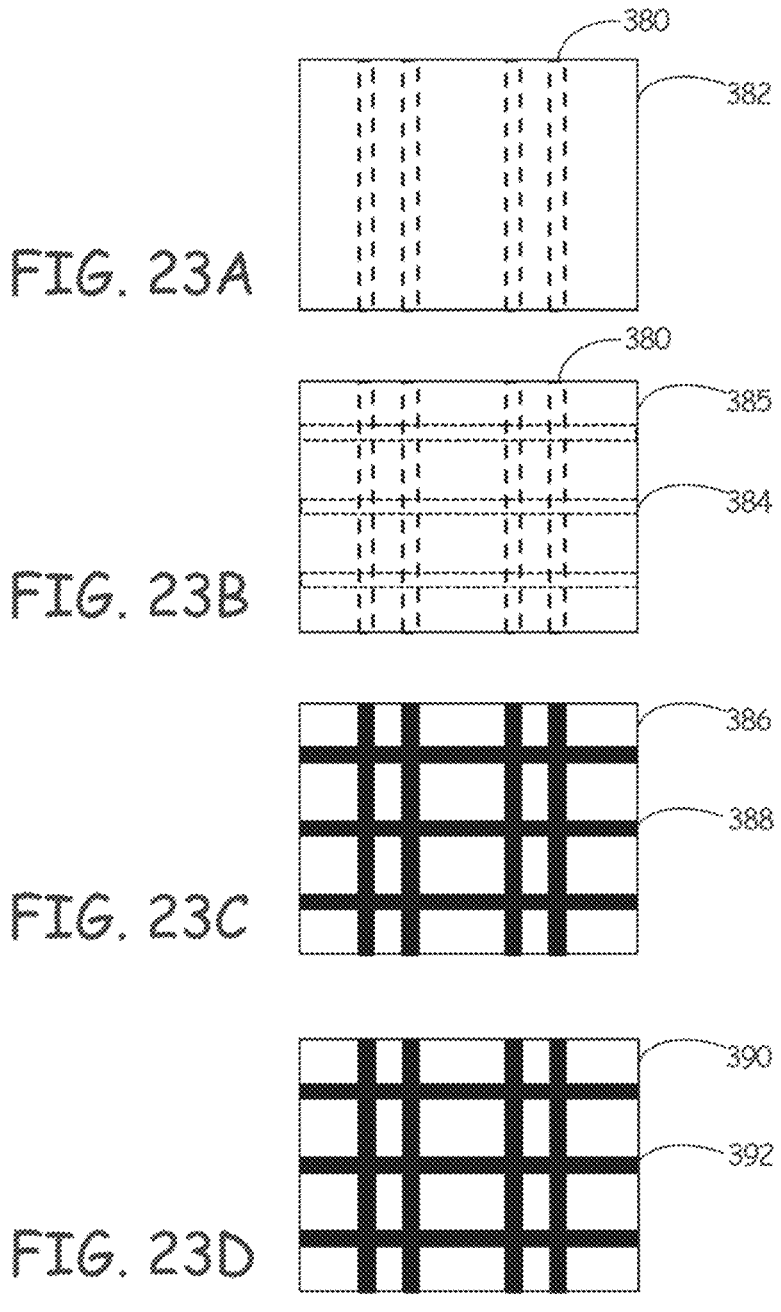
FIG. 23A is a schematic view of a radiation patterned structure with a latent image.
FIG. 23B is a schematic view of a radiation patterned structure with a combined latent image.
FIG. 23C is a schematic view of the structure of FIG. 23B after development of the combined latent image with a negative tone developer.
FIG. 23D is a schematic view of a patterned structure having a hardmask which has been etched into a pattern according to the structure of FIG. 23C.

FIGS. 23A-23D are directed to a litho-litho-etch process with latent features from the second irradiation step adding to the latent features from a first lithography step and then developed in a single step to form a pattern of organometallic material. FIG. 23A shows a patterned structure comprising condensed regions 380 of irradiated organometallic material and regions 382 of unirradiated organometallic material. The pattern formed by condensed regions 380 and unirradiated regions 382 represents a latent image into the organometallic material. The pattern is referred to as the first latent image. FIG. 23B shows the patterned structure of FIG. 23A after irradiation to form condensed regions 384 of irradiated organometallic material. The pattern formed by condensed regions 380, condensed regions 384 and unirradiated regions 385 represents a latent image into the organometallic material. The pattern is referred to as the combined latent image. Referring to FIG. 23C, the combined latent image of the structure shown in FIG. 23B has been developed through contact with a developer for a negative tone image to remove unirradiated organometallic material from unirradiated regions 385 to form the patterned structure of FIG. 23C. The patterned structure of FIG. 23C comprises patterned organometallic material 388 on hardmask layer 386. Referring to FIG. 23D, after etching of hardmask layer

386 according to the patterned structure of FIG. 23C, etched hardmask 394 exposes substrate 390 along the top surface. Etched hardmask 394 corresponds to the positions of patterned organometallic material 388. Generally, patterned organometallic material 388 is stripped prior to further processing. Further processing of the patterned structure of FIG. 23D may include etching into substrate 390, as depicted in FIG. 3, for example. Alternatively or additionally, depositions can be delivered to substrate 390 through openings formed by etched hardmask 394, which can be performed with or without first etching the substrate.

Figure 24A:
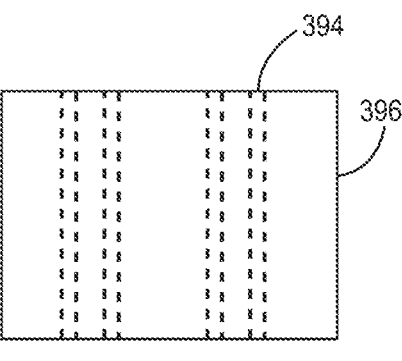
FIG. 24A is a schematic view of a radiation patterned structure with a latent image.
Figure 24B:
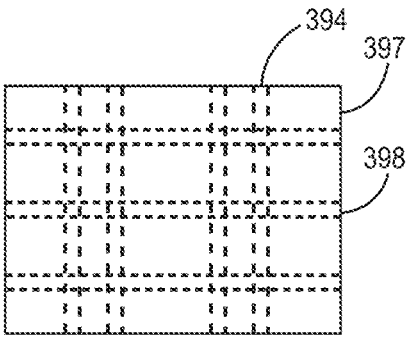
FIG. 24B is a schematic view of a radiation patterned structure with a combined latent image.
Figure 24C:
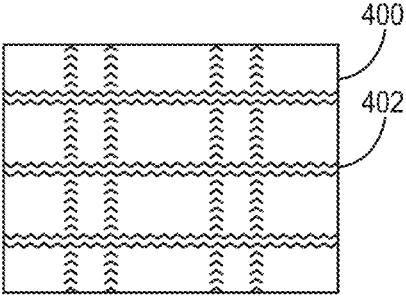
FIG. 24C is a schematic view of the structure of FIG. 24B after development of the combined latent image with a positive tone developer.
Figure 24D:
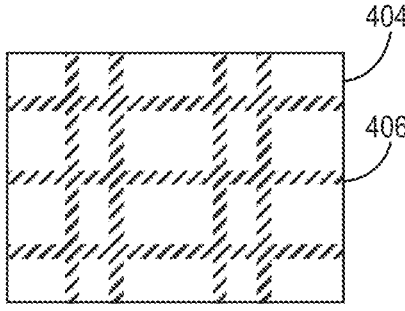
FIG. 24D is a schematic view of a patterned structure having a hardmask which has been etched into a pattern according to the structure of FIG. 24C.

FIGS. 24A-24D are directed to a litho-litho-etch process that is similar to the previous process but uses a positive tone developer instead of a negative tone developer. FIG. 24A shows a patterned structure comprising condensed regions 394 of irradiated organometallic material and regions 396 of unirradiated organometallic material. The pattern formed by irradiated regions 394 and unirradiated regions 396 represents a latent image into the organometallic material. The pattern is referred to as the first latent image. FIG. 24B shows the patterned structure of FIG. 24A after irradiation to form irradiated regions 398 of irradiated organometallic material. The pattern formed by irradiated regions 394, irradiated regions 398, and unirradiated regions 397 represents a latent image into the organometallic material. The pattern is referred to as the combined latent image. Referring to FIG. 24C, the combined latent image of the structure shown in FIG. 24B has been developed through contact with a developer for a positive tone image to remove irradiated organometallic material from irradiated regions 394 and irradiated regions 398 to form the patterned structure of FIG. 24C. The patterned structure of FIG. 24C comprises patterned organometallic material 400 on hardmask layer 402. Referring to FIG. 24D, after etching of hardmask layer 402 according to the patterned structure of FIG. 24C, etched hardmask 404 exposes substrate 406 along its top surface. Etched hardmask 404 corresponds to the positions of patterned organometallic material 400. Generally, patterned organometallic material 388 is stripped prior to further processing. Further processing of the patterned structure of FIG. 24D may include etching into substrate 406, as depicted in FIG. 3, for example. Alternatively, or additionally, depositions can be delivered to substrate 406 through openings formed by etched hardmask 404, which can be performed with or without first etching the substrate.

The various multiple patterning processes depicted in FIGS. 1-24D can be combined in various reasonable ways, as described generally above. The Example below describes methods for performing LFLF on an organotin resist using EUV lithography.

With the multiple patterning processes described herein, rectangular holes can be formed having an average size of no more than about 50 nm, in further embodiments no more than 40 nm, in other embodiments no more than 30 nm, and in additional embodiments from 20 nm to 30 nm. Size refers to a diameter or to a diagonal length for a rectangular hole, and a person of ordinary skill in the art can evaluate an appropriate size based on this for other shapes. A person of ordinary skill in the art will recognize that additional ranges of hole size within these explicit ranges are contemplated and are within the present disclosure.

Example: Double Patterning Contact Holes

This example demonstrates methods of double patterning with an organotin photoresist wherein a first layer of photosensitive organotin material is patterned on a substrate, whereupon a subsequent layer of photosensitive organotin material is deposited atop the first patterned layer and patterned perpendicular to the first pattern to result in a crosshatched pattern.

The substrate in this example consisted of a Si wafer coated with 10 nm of spin-on-glass (SOG) as an underlayer, however the underlayer identity is not particularly important to practice this method. Other underlayers can be used insofar as they provide adequate adhesion and enable sufficient lithographic performance. The organotin resist used in this example was YATU1011, manufactured by Inpria Corporation and having a composition as described in U.S. Pat. No. 10,228,618 by Meyers et al. entitled "Organotin Oxide Hydroxide Patterning Compositions, Precursors, And Patterning"

A first organotin layer was deposited via spin coating at 1394 rpm to give a film having a thickness of approximately 22 nm, and followed by a post-application bake (PAB) step performed at 100° C. for 60 seconds. Following the PAB step, the wafer is exposed to EUV radiation on an ASML NXE3300 scanner to form a first radiation patterned layer. After exposure, a post-exposure bake (PEB) was performed at 170° C. for 60 seconds. The first patterned layer is then developed and subjected to a hard bake at 250° C. for 60s to produce a first pattern of parallel 16.0 nm lines on a 32.0 nm pitch on the now patterned substrate. The hard bake is employed to "freeze" the pattern; in other words, to render it completely insoluble in the subsequent lithographic process.

Figure 25:
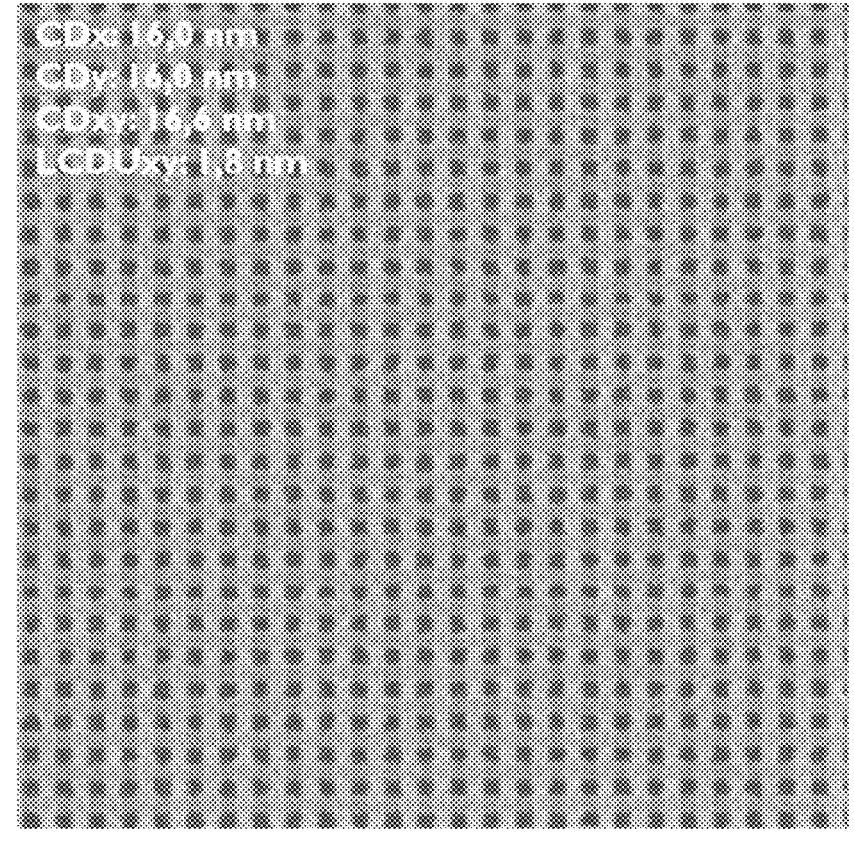
FIG. 25 is a CD-SEM image of the crosshatched tin oxide pattern prepared with the double patterning process described in the Example.

After the first patterned substrate is produced, a second layer of organotin material can be deposited on top of the patterned substrate and subjected to a PAB using identical processes and conditions employed for formation of the first organotin layer. Next, the wafer was rotated 90° and exposed to EUV radiation on an ASML NXE3300 scanner. Due to the 90° rotation of the wafer relative to the first pattern, the second exposure produces a radiation pattern that is perpendicular to the first. After exposure, the wafer is subjected to a PEB at 170° C. for 60 seconds, developed, and hard baked at 250° C. for 60 seconds to form a double patterned substrate. FIG. 25 shows a CD-SEM image of the final product. A crosshatched pattern is seen wherein lines in the x direction are produced in the first patterning step, and the lines in the y direction are produced in the second patterning step. The crosshatched pattern has 16.0 nm lines of organotin material with a line width roughness of 1.8 nm on a 32.0 nm pitch, forming approximately 16.6 nm square holes. This structure can be a useful method for producing contact holes.

In both lithography steps, the developer composition comprised PGME and acetic acid as described in U.S. patent application Ser. No. 16/845,511 by Jiang et al. entitled "Organometallic Photoresist Developer Compositions". Other developers can be used, such as 2-heptanone and others described in U.S. Pat. No. 9,310,684, entitled "Organometallic Solution Based High Resolution Patterning Compositions" and U.S. Pat. No. 10,228,618 by Meyers et al. entitled "Organotin Oxide Hydroxide Patterning Compositions, Precursors, And Patterning"

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to measurement error for the particular parameter unless explicitly indicated otherwise, as would be understood by a person of ordinary skill in the art based on the teachings herein.

What is claimed is:

1. A structure comprising:
   a substrate;
   an unpatterned hardmask coating on the substrate;
   a first patterned layer comprising a first pattern of a first tin oxide based material over the hardmask coating wherein gaps in the first pattern do not cover the hardmask coating; and
   a second patterned layer comprising a second pattern of a second tin oxide based material, wherein the second patterned layer is over the hardmask coating with the first pattern, wherein portions of the second tin oxide based material overlap with portions of the first tin oxide based material, wherein the second pattern is distinct from the first pattern and wherein the second pattern comprises open regions which extend to the hardmask coating, with the proviso that the second tin oxide based material is insoluble in aqueous base, and wherein the first pattern comprises a regular pattern of repeating structural elements with cuts in the first tin oxide based material of the regular pattern that correspond to the open regions in the second pattern such that the open regions extend through the second tin oxide based material and the first tin oxide based material to the hard mask coating.

2. The structure of claim 1 wherein the regular pattern comprises a line-space pattern, a pillar pattern, or a combination thereof.

3. The structure of claim 1 wherein the regular pattern comprises a line-space pattern, wherein the line-space pattern has an average pitch of no more than about 60 nm.

4. The structure of claim 1 wherein the first tin oxide based material and the second tin oxide based material have the same composition with the exception that the first tin oxide based material is at least partially condensed relative to the second tin oxide based material.

5. The structure of claim 1 wherein the first tin oxide based material and the second tin oxide based material comprise an organometallic oxide/hydroxide network.

6. The structure of claim 5 wherein the organometallic oxide/hydroxide network is represented by the formula $R_zSnO_{(2-(z/2)-(x/2))}(OH)_x$ where $0<z\leq2$, $x>0$, and $0<(z+x)\leq4$, wherein R comprises a hydrocarbyl group with 1-31 carbon atoms or blends thereof, and wherein R forms a carbon-tin bond.

7. The structure of claim 1 wherein the aqueous base comprises a quaternary ammonium hydroxide composition.

8. The structure of claim 1 wherein the aqueous base comprises from about 0.5 to about 30 weight percent tetraalkylammonium hydroxide.

9. The structure of claim 1 wherein the aqueous base comprises 2.38 weight percent tetramethylammonium hydroxide.

10. The structure of claim 1 wherein the first tin oxide material is insoluble in organic solvent.

11. The structure of claim 1 wherein the second pattern comprises a line-space pattern, a pillar pattern, or a combination thereof.

12. The structure of claim 1 wherein the second pattern comprises open regions with irregular spacing.

13. The structure of claim 1 wherein the line width roughness of the regular pattern is no more than about 5.5 nm.

* * * * *